(12) United States Patent
Joe et al.

(10) Patent No.: US 12,740,138 B2
(45) Date of Patent: Sep. 15, 2026

(54) SEMICONDUCTOR DEVICE

(71) Applicant: SAMSUNG ELECTRONICS CO., LTD., Suwon-si (KR)

(72) Inventors: Jinyeong Joe, Suwon-si (KR); Hyohoon Byeon, Suwon-si (KR); Namhyun Lee, Suwon-si (KR); Sungkeun Lim, Suwon-si (KR); Yuyeong Jo, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 538 days.

(21) Appl. No.: 18/196,191

(22) Filed: May 11, 2023

(65) Prior Publication Data

US 2023/0402458 A1 Dec. 14, 2023

(30) Foreign Application Priority Data

Jun. 13, 2022 (KR) ........................ 10-2022-0071545

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/17*** | (2025.01) |
| ***H10D 64/01*** | (2025.01) |
| ***H10D 84/01*** | (2026.01) |
| ***H10D 84/03*** | (2025.01) |
| ***H10D 88/00*** | (2026.01) |

(52) U.S. Cl.
CPC ......... *H10D 84/856* (2025.01); *H10D 30/014* (2025.01); *H10D 30/43* (2025.01); *H10D 30/6729* (2025.01); *H10D 30/6735* (2025.01); *H10D 62/121* (2025.01); *H10D 62/292* (2025.01); *H10D 64/017* (2025.01); *H10D 84/0167* (2025.01); *H10D 84/017* (2025.01); *H10D 84/038* (2025.01); *H10D 88/01* (2025.01)

(58) Field of Classification Search
None
See application file for complete search history.

(56) References Cited

U.S. PATENT DOCUMENTS 10,991,711 B2 4/2021 Reznicek et al.
11,069,684 B1 7/2021 Xie et al.
(Continued)

*Primary Examiner* — Julio J Maldonado
*Assistant Examiner* — Pinaki Das
(74) *Attorney, Agent, or Firm* — Sughrue Mion, PLLC

(57) ABSTRACT

A semiconductor device includes a first transistor structure on a substrate, the first transistor structure including first channel layers spaced apart from each other, a first gate electrode surrounding the first channel layers, a first source/drain region connected to the first channel layers on a first side of the first gate electrode, and a second source/drain region connected to the first channel layers on a second side of the first gate electrode that is opposite to the first side of the first gate electrode, and a second transistor structure on the first transistor structure, the second transistor structure including second channel layers spaced apart from each other, a second gate electrode surrounding the second channel layers, and a third source/drain region connected to the second channel layers on a first side of the second gate electrode.

20 Claims, 28 Drawing Sheets

(56) References Cited

U.S. PATENT DOCUMENTS 11,145,668 B2 10/2021 Reznicek et al.
11,158,544 B2 10/2021 Cheng et al.
11,164,793 B2 11/2021 Xie et al.
11,177,258 B2 11/2021 Xie et al.
2016/0254261 A1* 9/2016 Machkaoutsan ............................ H01L 21/32133 257/369
2016/0322368 A1 11/2016 Sun et al.
2017/0287826 A1 10/2017 Guo et al.
2019/0131394 A1* 5/2019 Reznicek ........... H10D 30/6739
2019/0172828 A1* 6/2019 Smith .................... H10D 88/00
2020/0105751 A1* 4/2020 Dewey ................. H10D 62/235
2021/0098455 A1* 4/2021 Yu ...................... H10D 84/0177
2021/0193844 A1* 6/2021 Ramaswamy ....... H10D 62/299
2021/0320035 A1 10/2021 Xie et al.
2021/0349691 A1 11/2021 Hekmatshoartabari et al.
2022/0199620 A1* 6/2022 Thomas ............... H10D 64/691
2023/0007959 A1* 1/2023 Joe ....................... H10D 30/024
2024/0120239 A1* 4/2024 Chang ................ H10D 84/0144

* cited by examiner 245
245c
245b
245a
222
263
262
261
228
233
232
231
260
230
221
205
210
III
III'
Z
Y
X
250
II
II'
218a
218b
201
I
I'

SEMICONDUCTOR DEVICE

CROSS-REFERENCE TO RELATED APPLICATION(S)

This application is based on and claims priority to Korean Patent Application No. 10-2022-0071545 filed on Jun. 13, 2022 in the Korean Intellectual Property Office, the disclosure of which is incorporated herein by reference in its entirety.

BACKGROUND

One or more example embodiments relate to a semiconductor device.

As demand for implementation of high performance, high speed, and/or multifunctionalization of a semiconductor device increases, a degree of integration of the semiconductor device has been increased. In order to overcome a limitation of operating properties due to the size reduction of planar metal oxide semiconductor field effect transistors (FETs), efforts have been made to develop a semiconductor device including a FinFET having a channel in the form of a fin and a gate-all-around field effect transistor including nanosheets surrounded by a gate.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor device having improved electrical properties and reliability.

Additional aspects will be set forth in part in the description which follows and, in part, will be apparent from the description, or may be learned by practice of the presented embodiments.

According to an aspect of an example embodiment, a semiconductor device may include a first transistor structure on a substrate, the first transistor structure including first channel layers spaced apart from each other, a first gate electrode surrounding the first channel layers, a first source/drain region connected to the first channel layers on a first side of the first gate electrode, and a second source/drain region connected to the first channel layers on a second side of the first gate electrode that is opposite to the first side of the first gate electrode, and a second transistor structure on the first transistor structure, the second transistor structure including second channel layers spaced apart from each other, a second gate electrode surrounding the second channel layers, a third source/drain region connected to the second channel layers on a first side of the second gate electrode, and a fourth source/drain region connected to the second channel layers on a second side of the second gate electrode that is opposite to first side of the second gate electrode, where a width of an upper surface of an uppermost first channel layer among the first channel layers may be less than a width of a lower surface of the uppermost first channel layer, a width of a lower surface of a lowermost second channel layer among the second channel layers may be less than a width of an upper surface of the lowermost second channel layer, and at least one channel layer of the first channel layers and the second channel layers may include a semiconductor layer including at least one of carbon (C) and oxygen (O).

According to an aspect of an example embodiment, a semiconductor device may include a first transistor structure on a substrate, the first transistor structure including first channel layers spaced apart from each other, a first gate electrode surrounding the first channel layers, a first source/drain region connected to the first channel layers on a first side of the first gate electrode, and a second source/drain region connected to the first channel layers on a second side of the first gate electrode that is opposite to the first side of the first gate electrode, and a second transistor structure on the first transistor structure, the second transistor structure including second channel layers spaced apart from each other, a second gate electrode surrounding the second channel layers, a third source/drain region connected to the second channel layers on a first side of the second gate electrode, and a fourth source/drain region connected to the second channel layers on a second side of the second gate electrode that is opposite to the first side of the second gate electrode, where at least one channel layer of the first channel layers and the second channel layers may include a semiconductor layer including an impurity, the semiconductor layer may include a region in which a concentration of the impurity changes based on a height in a vertical direction, perpendicular to an upper surface of the substrate, and the impurity may include at least one of carbon (C) and oxygen (O).

According to an aspect of an example embodiment, a semiconductor device may include an active fin on a substrate extending in a first direction, first channel layers on the active fin and spaced apart from each other, a first gate electrode surrounding the first channel layers and extending in a second direction that intersects the first direction, a second source/drain region connected to the first channel layers on a second side of the first gate electrode that is opposite to the first side of the first gate electrode, second channel layers vertically overlapping the first channel layers and spaced apart from each other, a second gate electrode surrounding the second channel layers, extending in the second direction, and vertically overlapping the first gate electrode, a third source/drain region connected to the second channel layers on a first side of the second gate electrode, and a fourth source/drain region connected to the second channel layers on a second side of the second gate electrode that is opposite to the first side of the second gate electrode, where the first channel layers may include a first semiconductor layer including a first impurity, the first semiconductor layer being an uppermost channel layer among the first channel layers, the second channel layers may include a second semiconductor layer including a second impurity, the second semiconductor layer being a lowermost channel layer among the second channel layers, an upper surface or a lower surface of the first semiconductor layer may include the first impurity in a first concentration, a central portion of the first semiconductor layer may include the first impurity in a second concentration that is lower than the first concentration, an upper surface or a lower surface of the second semiconductor layer may include the second impurity in a third concentration, a central portion of the second semiconductor layer may include the second impurity in a fourth concentration that is lower than the third concentration, and each of the first impurity and the second impurity comprises at least one of carbon (C) and oxygen (O).

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1A:
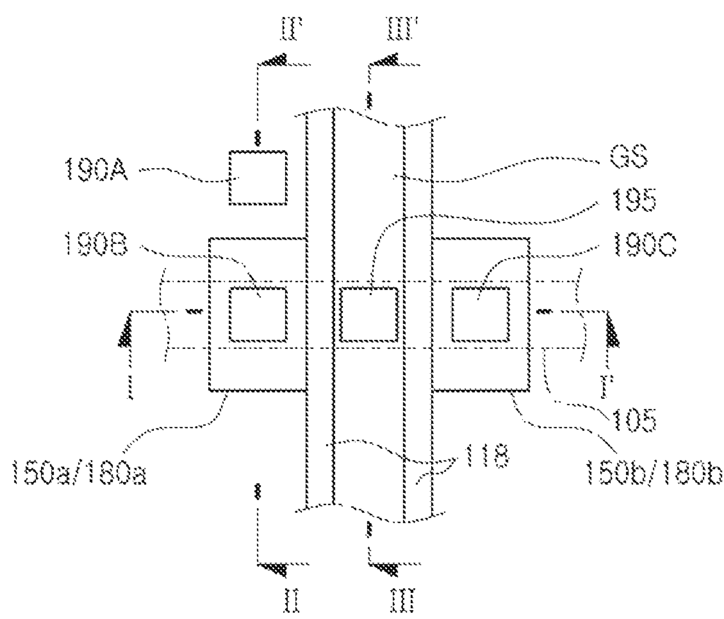
FIG. 1A is a diagram illustrating a semiconductor device according to example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1A is a diagram illustrating a semiconductor device according to example embodiments.

Figure 1B:
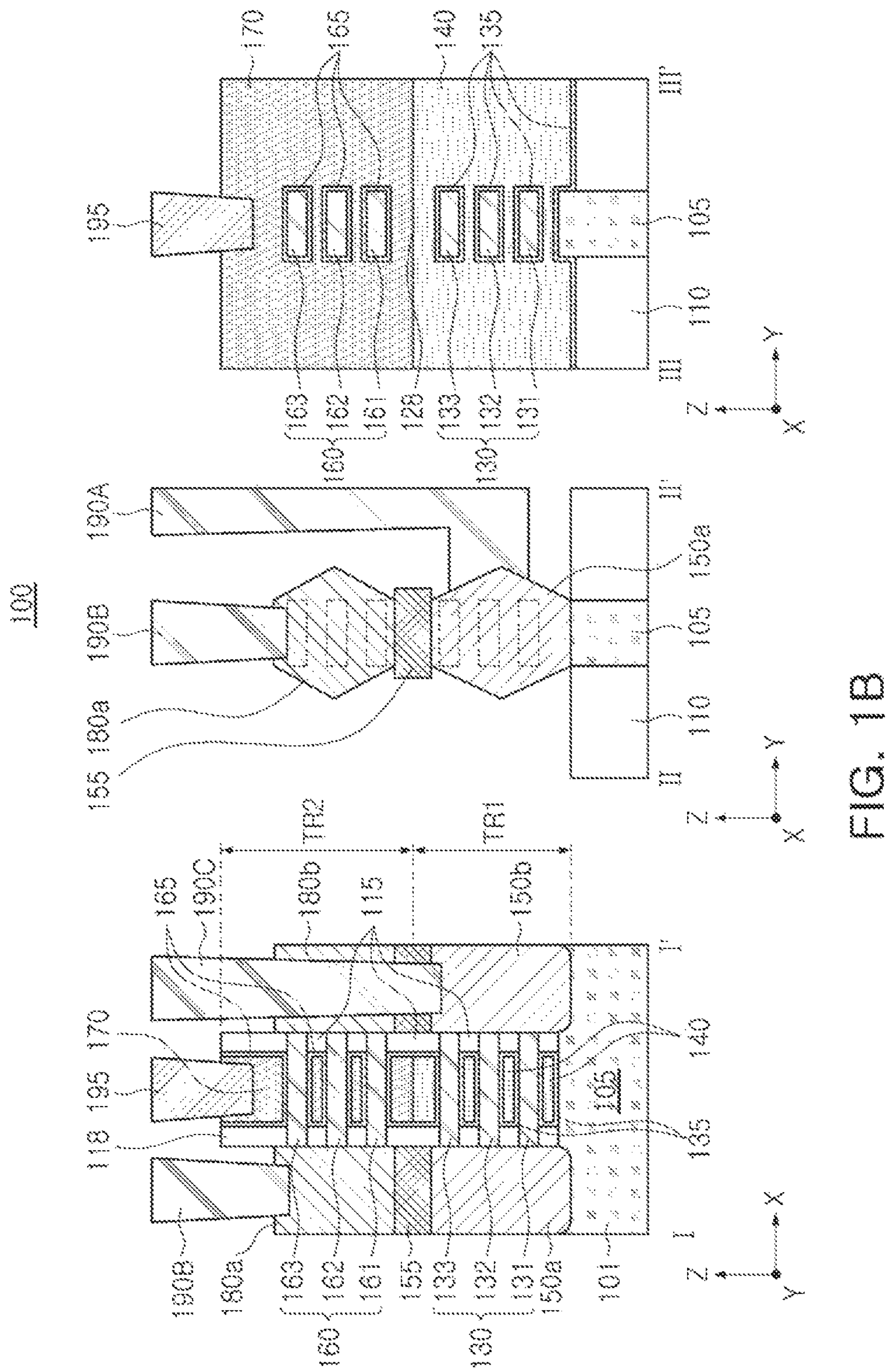
FIG. 1B is a cross-sectional view illustrating a semiconductor device according to example embodiments.

FIG. 1B is a cross-sectional view illustrating a semiconductor device according to example embodiments. FIG. 1B illustrates cross-sections of the semiconductor device of FIG. 1A taken along cutting lines I-I', II-II', and III-III'.

Referring to FIGS. 1A and 1B, a semiconductor device 100 may include a substrate 101 including an active fin 105, a first transistor structure TR1 on the substrate 101, and a second transistor structure TR2 on the first transistor structure TR1. The first and second transistor structures TR1 and TR2 may be vertically stacked in a Z-direction, and may provide a complementary field effect transistor (FET) (CFET). The first and second transistor structures TR1 and TR2 may provide an n-type metal-oxide-semiconductor FET (NMOSFET) on a p-type MOSFET (PMOSFET) or a PMOSFET on an NMOSFET. In another example, the semiconductor device 100 may stack transistor structures to provide a complimentary MOSFET (CMOSFET) on a CMOSFET.

The first transistor structure TR1 may include first channel layers 130, a first gate electrode 140 surrounding the first channel layers 130, a first source/drain region 150*a* and a second source/drain region 150*b* connected to the first channel layers 130 on opposite sides of the first gate electrode 140, and a first gate dielectric layer 135 between the first channel layers 130 and the first gate electrode 140.

The second transistor structure TR2 may include second channel layers 160, a second gate electrode 170 surrounding the second channel layers 160, a third source/drain region 180*a* and a fourth source/drain region 180*b* connected to the second channel layers 160 on opposite sides of the second gate electrode 170, and a second gate dielectric layer 165 between the second channel layers 160 and the second gate electrode 170.

The semiconductor device 100 may further include an isolation layer 110, inner spacers 115, gate spacers 118, an insulating layer 155 between the source/drain regions 150*a* and 150*b* of the first transistor structure TR1 and the source/drain regions 180*a* and 180*b* of the second transistor structure TR2, and contact plugs 190A, 190B, 190C, and 195.

In the semiconductor device 100, the active fin 105 may have a fin structure, and gate electrodes 140 and 170 may be disposed to surround the channel layers 130 and 160. Accordingly, the semiconductor device 100 may provide a multi bridge channel FET (MBCFET).

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

The active fin 105 may be defined by the isolation layer 110 in the substrate 101, and may be disposed to extend in a first direction, for example, an X-direction. The active fin 105 may have a structure protruding from the substrate 101. An upper end of the active fin 105 may be disposed to protrude to a predetermined height from an upper surface of the isolation layer 110. The active fin 105 may be formed as a portion of the substrate 101, or may include an epitaxial layer grown from the substrate 101. On opposite sides of a gate structure GS, the active fin 105 on the substrate 101 may be partially recessed, and the first and second source/drain regions 150*a* and 150*b* are formed on the recessed active fin 105. In some example embodiments, the active fin 105 may include impurities. A plurality of active fins 105 may be disposed to be spaced apart from each other in a second direction, for example, a Y-direction.

The isolation layer 110 may define the active fin 105 in the substrate 101. The isolation layer 110 may be formed by, for example, a shallow trench isolation (STI) process. The isolation layer 110 may expose upper side surfaces of the active fin 105. The isolation layer 110 may extend in the Y-direction, and may cover side surfaces below the exposed upper side surfaces of the active fin 105. In some example embodiments, the isolation layer 110 may include a region extending deeper into a lower portion of the substrate 101 between the active fins 105. The isolation layer 110 may have a curved upper surface having a higher level as a distance to the active fin 105 decreases, but the shape of the upper surface of the isolation layer 110 is not limited thereto. The isolation layer 110 may be formed of an insulating material. The isolation layer 110 may be, for example, silicon oxide, silicon nitride, silicon oxynitride, or a combination thereof.

The first channel layers 130 may be disposed on the active fin 105. The first channel layers 130 may include a plurality of semiconductor layers 131, 132, and 133 disposed to be spaced apart from each other in a direction, perpendicular to an upper surface of the substrate 101, for example, the Z-direction. The first channel layers 130 may be connected to the first and second source/drain regions 150*a* and 150*b*. The plurality of semiconductor layers 131, 132, and 133 included in the first channel layers 130 may be formed of a semiconductor material, for example, at least one of silicon (Si), silicon germanium (SiGe), and germanium (Ge).

The second channel layers 160 may be disposed on the first channel layers 130, and may vertically overlap the first channel layers 130. The second channel layers 160 may include a plurality of semiconductor layers 161, 162, and 163 disposed to be spaced apart from each other in the Z-direction. The second channel layers 160 may be connected to the third and fourth source/drain regions 180*a* and 180*b*. The plurality of semiconductor layers 161, 162, and 163 included in the second channel layers 160 may be formed of a semiconductor material, for example, at least one of silicon (Si), silicon germanium (SiGe), and germanium (Ge).

At least one of the first and second channel layers 130 and 160 may include a semiconductor layer including an impurity. The semiconductor layer may include a region in which a concentration of the impurity changes according to a height in the Z-direction. The impurity may include at least one of a carbon (C) element and an oxygen (O) element. A concentration distribution of the impurities will be further described with reference to FIGS. 2A to 2C below.

The first gate electrode 140 may intersect the active fin 105 and the first channel layers 130 on the active fin 105 to extend in the second direction, for example, the Y-direction. A channel region of a lower transistor may be formed in the active fin 105 and the first channel layers 130 intersecting the first gate electrode 140. The first gate electrode 140 may surround the first channel layers 130, and the first gate dielectric layer 135 may be disposed between the first gate electrode 140 and the first channel layers 130.

The second gate electrode 170 may intersect the second channel layers 160 on the first channel layers 130 to extend in the Y-direction. A channel region of an upper transistor may be formed in the second channel layers 160 intersecting the second gate electrode 170. The second gate electrode 170 may surround the second channel layers 160, and the second gate dielectric layer 165 may be disposed between the second gate electrode 170 and the second channel layers 160.

Each of the first and second gate electrodes 140 and 170 may include a conductive material, for example, at least one of W, Ti, Ta, Mo, TiN, TaN, WN, TiON, TiAlC, TiAlN, and TaAlC. The first and second gate electrodes 140 and 170 may include a semiconductor material such as doped polysilicon. Each of the first and second gate electrodes 140 and 170 may be formed of two or more multilayers.

The first and second gate dielectric layers 135 and 165 may include oxide, nitride, or a high-K material. The high-K material may refer to a dielectric material having a higher dielectric constant than that of a silicon oxide layer ($SiO_2$). The high-K material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The inner spacers 115 may be disposed between the gate electrodes 140 and 170 and the source/drain regions 150*a*, 150*b*, 180*a*, and 180*b*. The inner spacers 115 may include an insulating material such as silicon oxide, silicon nitride, or silicon oxynitride.

The gate spacers 118 may be disposed on opposite side surfaces of an upper region of the second gate electrode 170, and the upper region of the second gate electrode 170 may be disposed on a sixth semiconductor layer 163. In example embodiments, each of the gate spacers 118 may include a portion having a curved outer surface such that a width of an upper portion thereof the gate spacers 118 is smaller than a width of a lower portion thereof. The gate spacers 118 may have a multilayer structure in some example embodiments. The gate spacers 118 may include at least one of silicon oxide, silicon nitride, and silicon oxynitride.

The first and second source/drain regions 150*a* and 150*b* may be disposed on recessed regions of the active fin 105 on opposite sides of the first channel layers 130. The first and second source/drain regions 150*a* and 150*b* may serve as a source region or a drain region of the lower transistor. The first and second source/drain regions 150*a* and 150*b* may be disposed by partially recessing an upper portion of the active fin 105. However, in example embodiments, presence or absence of a recess and a depth of the recess may be changed in various manners.

The third and fourth source/drain regions 180*a* and 180*b* may be disposed on opposite sides of the second channel layers 160. The third and fourth source/drain regions 180*a* and 180*b* may serve as a source region or a drain region of the upper transistor. The third and fourth source/drain regions 180*a* and 180*b* may be spaced apart from the first and second source/drain regions 150*a* and 150*b* by the insulating layer 155.

The source/drain regions 150*a*, 150*b*, 180*a*, and 180*b* may include a semiconductor layer including silicon (Si), and may be formed of a plurality of epitaxial layers. The source/drain regions 150*a*, 150*b*, 180*a*, and 180*b* may include different types of impurities and/or impurities having different concentrations. For example, when the first transistor structure TR1 is a PMOSFET, the first and second source/drain regions 150*a* and 150*b* may include P-type doped silicon germanium (SiGe). When the second transistor structure TR2 is an NMOSFET, the third and fourth source/drain regions 180*a* and 180*b* may include N-type doped silicon (Si).

The contact plugs 190A, 190B, 190C, and 195 may be a first contact plug 190A electrically connected to the first source/drain region 150*a*, a second contact plug 190B electrically connected to the third source/drain region 180*a*, and a third contact plug 190C electrically connected to the second source/drain region 150*b* and the fourth source/drain region 180*b*. The first contact plug 190A may include a vertical extension extending in the Z-direction and a horizontal extension extending from a lower portion of the vertical extension toward the first source/drain region 150*a*.

The contact plugs 190A, 190B, 190C, and 195 may further include a gate contact plug 195 connected to the second gate electrode 170. The first gate electrode 140 and the second gate electrode 170 may be electrically connected to each other, and the same electrical signal may be applied through the gate contact plug 195.

The contact plugs 190A, 190B, 190C, and 195 may include, for example, at least one of titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo).

Figure 2A:
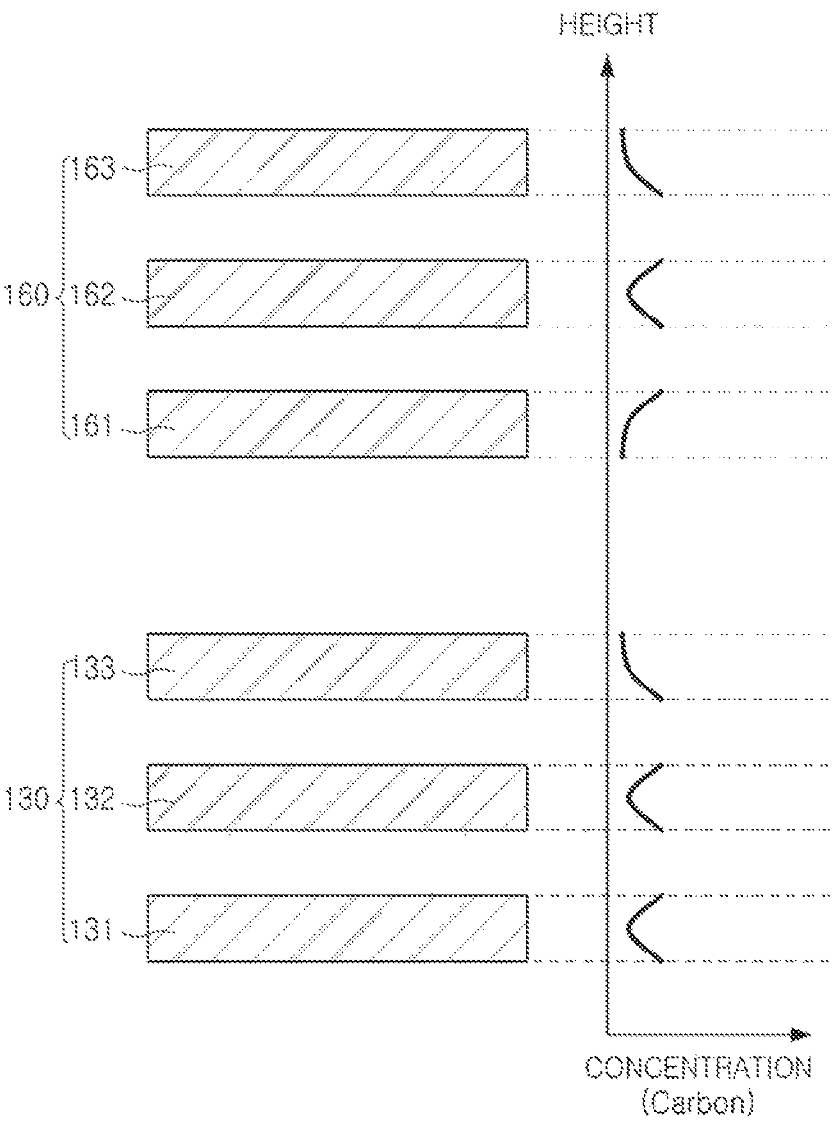
FIGS. 2A, 2B and 2C are diagrams illustrating, according to height, channel layers of a semiconductor device and an impurity concentration included in the channel layers according to example embodiments.
Figure 2B:
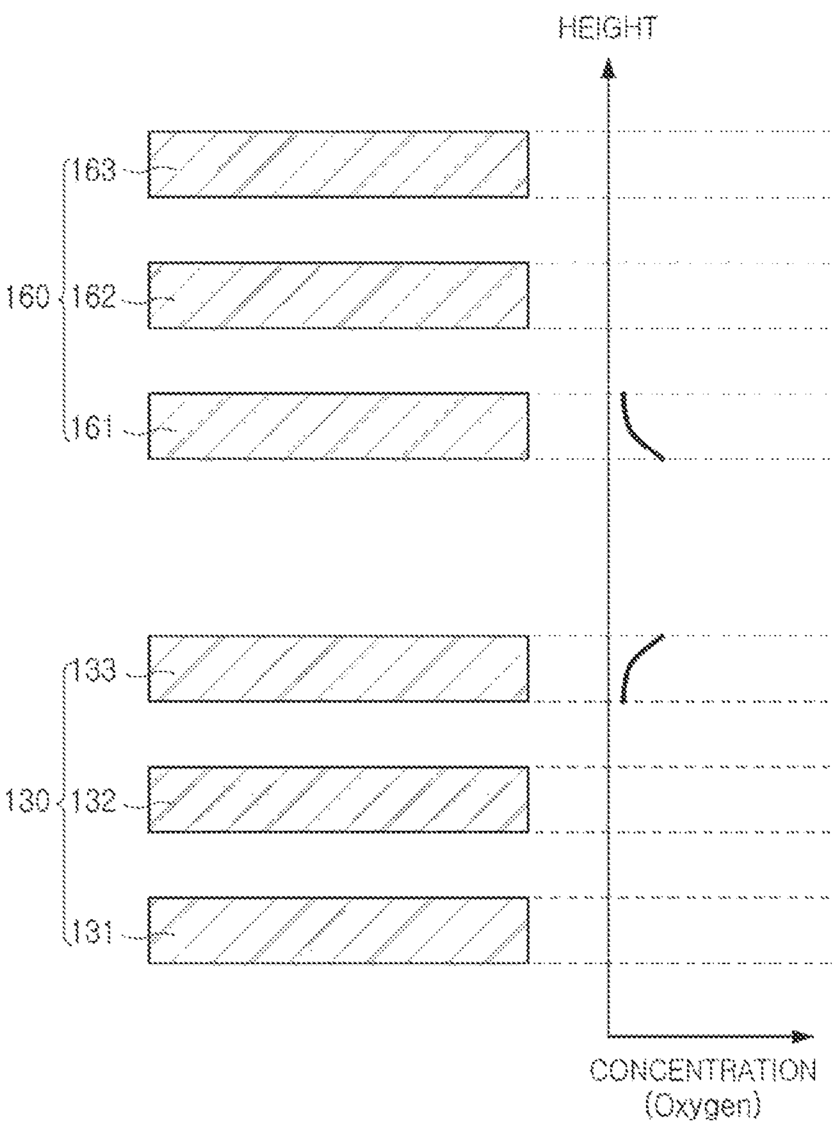
Figure 2C:
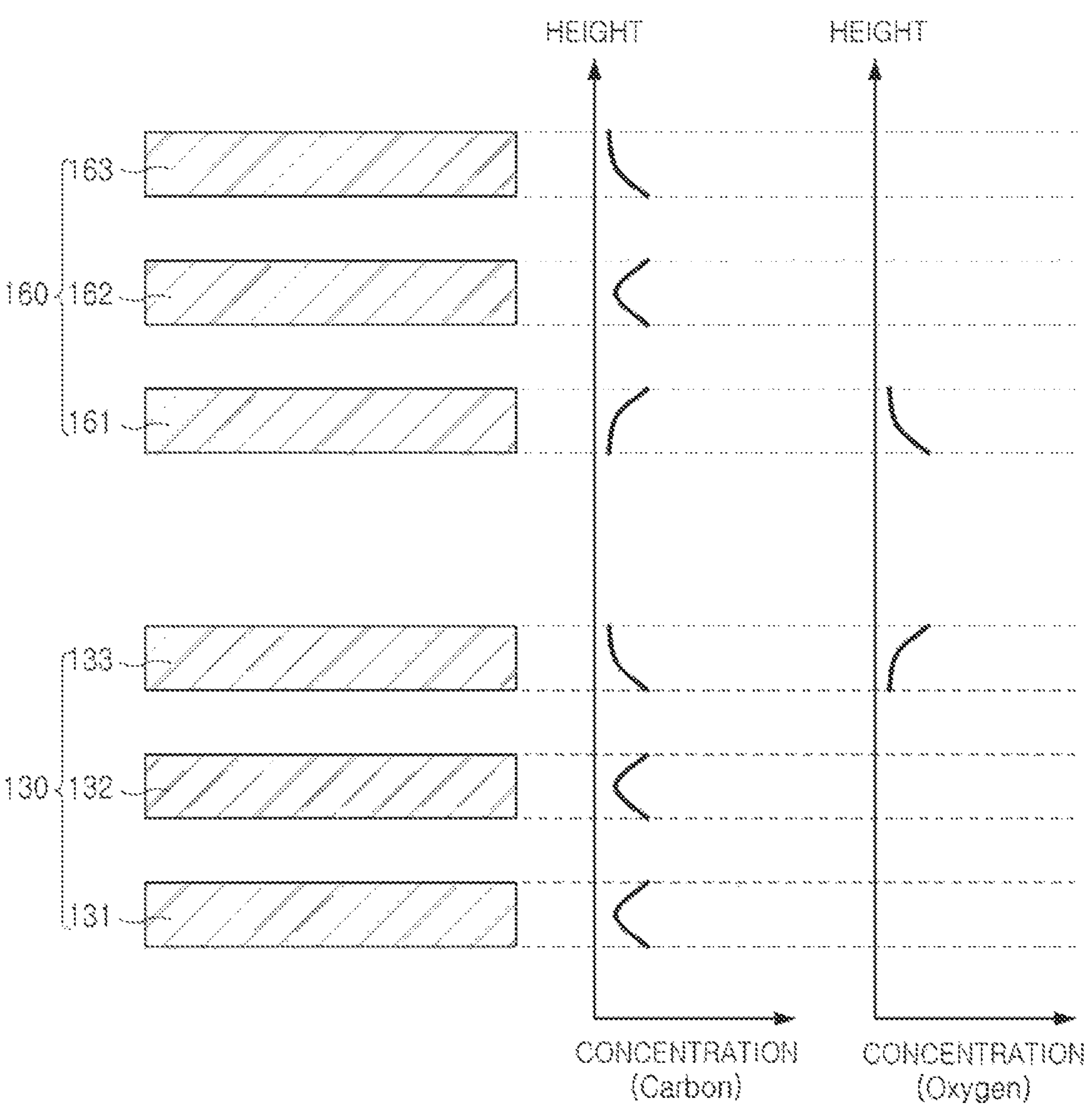

FIGS. 2A, 2B, and 2C are diagrams illustrating, according to height, channel layers of a semiconductor device and an impurity concentration included in the channel layers according to example embodiments. A type and a concentration distribution (or profile) of an impurity may be verified through energy dispersive X-ray spectroscopy (EDX), X-ray fluorescence spectrometry (XRF), X-ray photoelectron spectroscopy (XPS), atom probe tomography (APT), secondary ion mass spectrometry (SIMS), or the like.

Referring to FIGS. 2A to 2C, the first channel layers 130 may include a first semiconductor layer 131, a second semiconductor layer 132, and a third semiconductor layer 133 sequentially stacked in the Z-direction. The second channel layers 160 may include a fourth semiconductor layer 161, a fifth semiconductor layer 162, and a sixth semiconductor layer 163 sequentially stacked in the Z-direction.

Referring to FIG. 2A, the first semiconductor layer 131 may have a carbon concentration gradient in which a concentration of a carbon element decreases as a distance from an upper surface of the first semiconductor layer 131 and a lower surface of the first semiconductor layer 131 to a central portion of the first semiconductor layer 131 decreases. The second semiconductor layer 132 may have a carbon concentration gradient in which a concentration of a carbon element decreases as a distance from an upper surface of the second semiconductor layer 132 and a lower surface of the second semiconductor layer 132 to a central portion of the second semiconductor layer 132 decreases. The third semiconductor layer 133 may have a carbon concentration gradient in which a concentration of a carbon element decreases as a distance from a lower surface of the third semiconductor layer 133 to an upper surface of the third semiconductor layer 133 decreases. For example, the lower surface of the third semiconductor layer 133 may include the impurity (e.g., carbon) in a first concentration, and the upper surface or a central portion of the third semiconductor layer 133 may include the impurity (e.g., carbon) in a second concentration, lower than the first concentration.

Referring to FIG. 2A, the fourth semiconductor layer 161 may have a carbon concentration gradient in which a concentration of a carbon element decreases as a distance from an upper surface of the fourth semiconductor layer 161 to a lower surface of the fourth semiconductor layer 161 decreases. The fifth semiconductor layer 162 may have a carbon concentration gradient in which a concentration of a carbon element decreases as a distance from an upper surface of the fifth semiconductor layer 162 and a lower surface of the fifth semiconductor layer 162 to a central portion of the fifth semiconductor layer 162 decreases. The sixth semiconductor layer 163 may have a carbon concentration gradient in which a concentration of a carbon element decreases as a distance from a lower surface of the sixth semiconductor layer 163 to an upper surface of the sixth semiconductor layer 163 decreases. For example, the upper surface of the fourth semiconductor layer 161 may include the impurity (e.g., carbon) in a first concentration, and the lower surface or a central portion of the fourth semiconductor layer 161 may include the impurity (e.g., carbon) in a second concentration, lower than the first concentration.

Referring to FIG. 2A, a total content of the impurity (e.g., carbon) included in the second semiconductor layer 132 between the first semiconductor layer 131 and the third semiconductor layer 133 may be greater than a total content of the impurity (e.g., carbon) included in the first semiconductor layer 131 and a total content of the impurity (e.g., carbon) included in the third semiconductor layer 133. A total content of the impurity (e.g., carbon) included in the fifth semiconductor layer 162 between the fourth semiconductor layer 161 and the sixth semiconductor layer 163 may be greater than a total content of the impurity (e.g., carbon) included in the fourth semiconductor layer 161 and a total content of the impurity (e.g., carbon) included in the sixth semiconductor layer 163.

In FIG. 2A, the active fin 105 may include an impurity, and the impurity included in the active fin 105 may have a concentration decreasing downward from an upper surface of the active fin 105. The impurity included in the active fin 105 may be the same as the impurity included in the first to sixth semiconductor layers 131, 132, 133, 161, 162, and 163. For example, the impurity included in the active fin 105 may be a carbon element.

Referring to FIG. 2B, the third semiconductor layer 133 may have an oxygen concentration gradient in which a concentration of an oxygen element decreases as a distance from an upper surface of the third semiconductor layer 133 to a lower surface of the third semiconductor layer 133 decreases, and the fourth semiconductor layer 161 may have an oxygen concentration gradient in which a concentration of an oxygen element decreases as a distance from a lower surface of the fourth semiconductor layer 161 to an upper surface of the fourth semiconductor layer 161 decreases. For example, the upper surface of the third semiconductor layer 133 may include the impurity (e.g., oxygen) in a first concentration, and the lower surface or a central portion of the third semiconductor layer 133 may include the impurity (e.g., oxygen) in a second concentration, lower than the first concentration. For example, the lower surface of the fourth semiconductor layer 161 may include the impurity (e.g., oxygen) in a first concentration, and the upper surface or a central portion of the fourth semiconductor layer 161 may include the impurity (e.g., oxygen) in a second concentration, lower than the first concentration.

Referring to FIG. 2C, the first to sixth semiconductor layers 131, 132, 133, 161, 162, and 163 may have an impurity (e.g., carbon) concentration distribution illustrated in FIG. 2A, and the third semiconductor layer 133 and the fourth semiconductor layer 161 may have an impurity (e.g., oxygen) concentration distribution illustrated in FIG. 2B.

Figure 3:
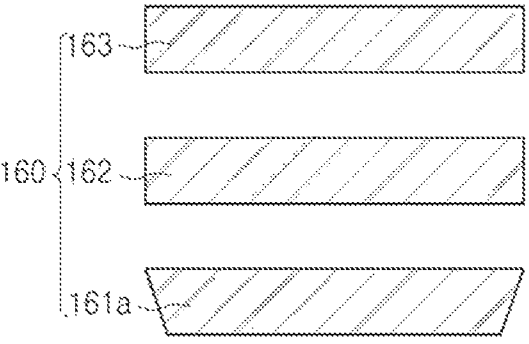
FIG. 3 is a diagram illustrating channel layers of a semiconductor device according to example embodiments.
Figure 3:
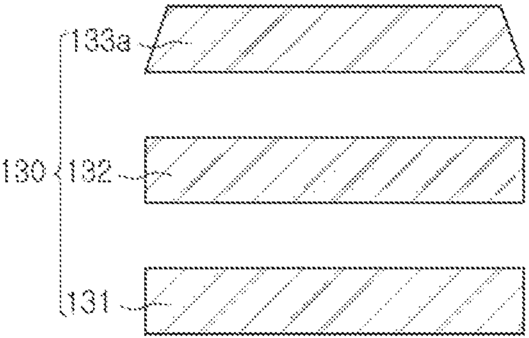

FIG. 3 is a diagram illustrating channel layers of a semiconductor device according to example embodiments.

Referring to FIG. 3, a third semiconductor layer 133*a*, disposed on a level of an uppermost channel layer among the first channel layers 130, may have an inclined side surface, and a fourth semiconductor layer 161*a*, disposed on a level of a lowermost channel layer among the second channel layers 160, may have an inclined side surface. For example, a width of an upper surface of the third semiconductor layer 133 may be smaller than a width of a lower surface of the third semiconductor layer 133, and a width of a lower surface of the fourth semiconductor layer 161 may be smaller than a width of an upper surface of the fourth semiconductor layer 161.

Figure 4A:
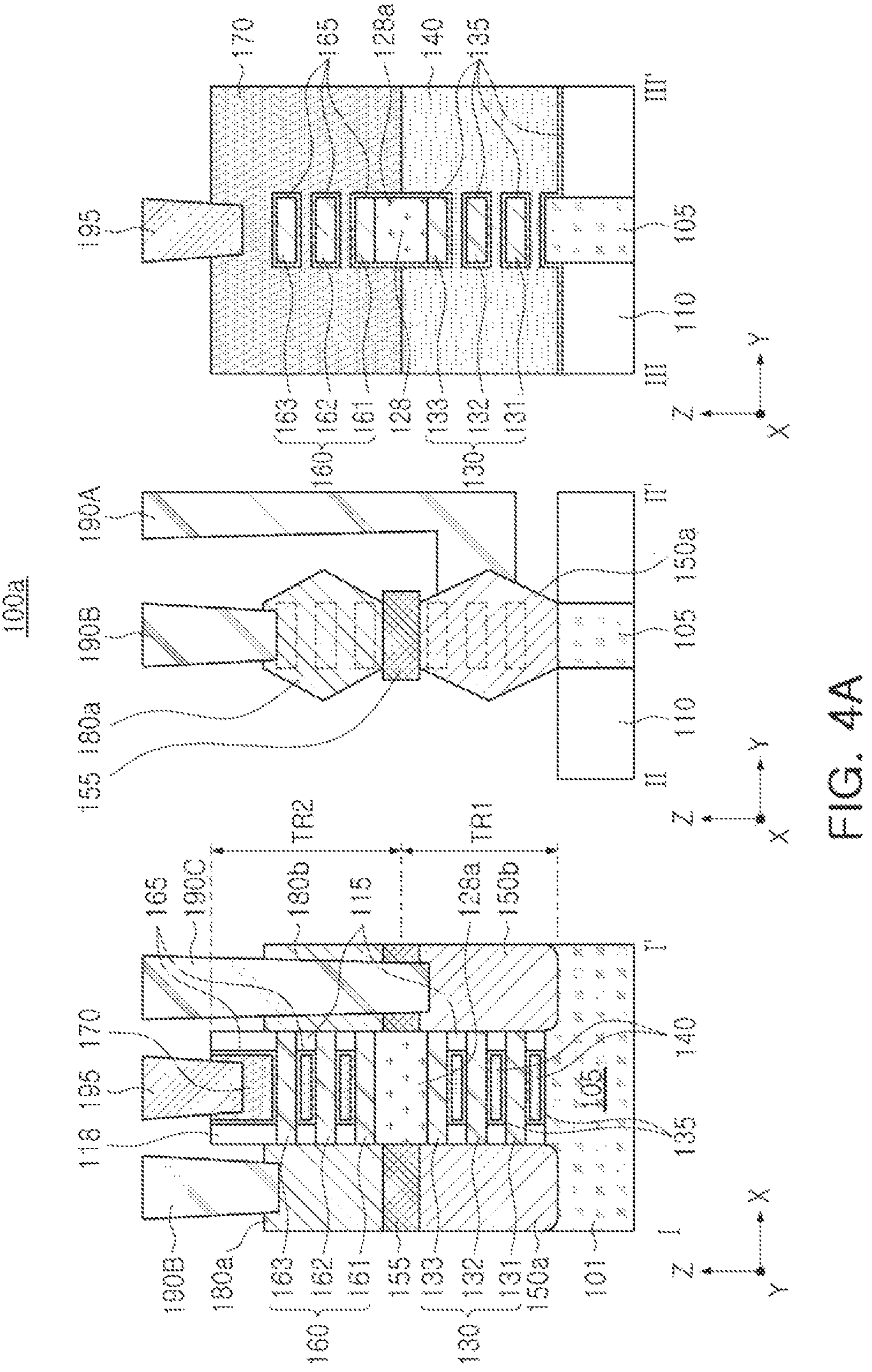
FIGS. 4A and 4B are cross-sectional views illustrating a semiconductor device according to example embodiments.
Figure 4B:
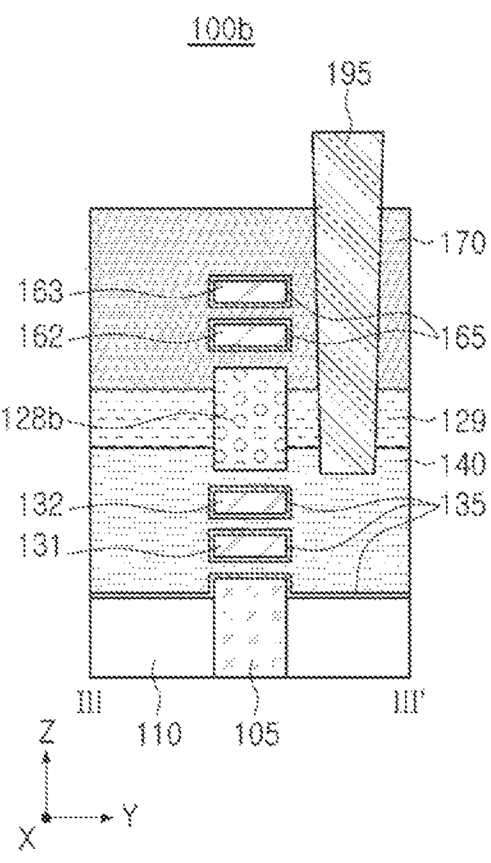

FIGS. 4A and 4B are cross-sectional views illustrating a semiconductor device according to example embodiments.

Referring to FIG. 4A, the semiconductor device may include an intermediate layer 128*a* (hereinafter, referred to interchangeably as "intermediate sacrificial layer") disposed between the first gate electrode 140 and the second gate electrode 170, the intermediate layer 128*a* including an insulating material. The intermediate layer 128*a* may be disposed between the third semiconductor layer 133 and the fourth semiconductor layer 161. The intermediate layer 128*a* may include a single insulating material layer or a plurality of insulating material layers.

Referring to FIG. 4B, the semiconductor device may include an intermediate insulating layer 129 disposed between the first gate electrode 140 and the second gate electrode 170, the intermediate insulating layer 129 including an insulating material, and an intermediate layer 128*b* disposed between the second semiconductor layer 132 and the fifth semiconductor layer 162, the intermediate layer 128*b* including an insulating material. Each of the intermediate layer 128*b* and the intermediate insulating layer 129 may include a single insulating material layer or a plurality of insulating material layers. The intermediate layer 128*b* may include a conductive material. The gate contact plug 195 may pass through the second gate electrode 170 and the intermediate insulating layer 129 to contact the first gate electrode 140.

FIGS. 5A, 5B, 5C, 5D, 6, 7, 8A, 8B, 9 and 10 are diagrams illustrating a method of manufacturing a semiconductor device according to example embodiments.

Figure 5A:
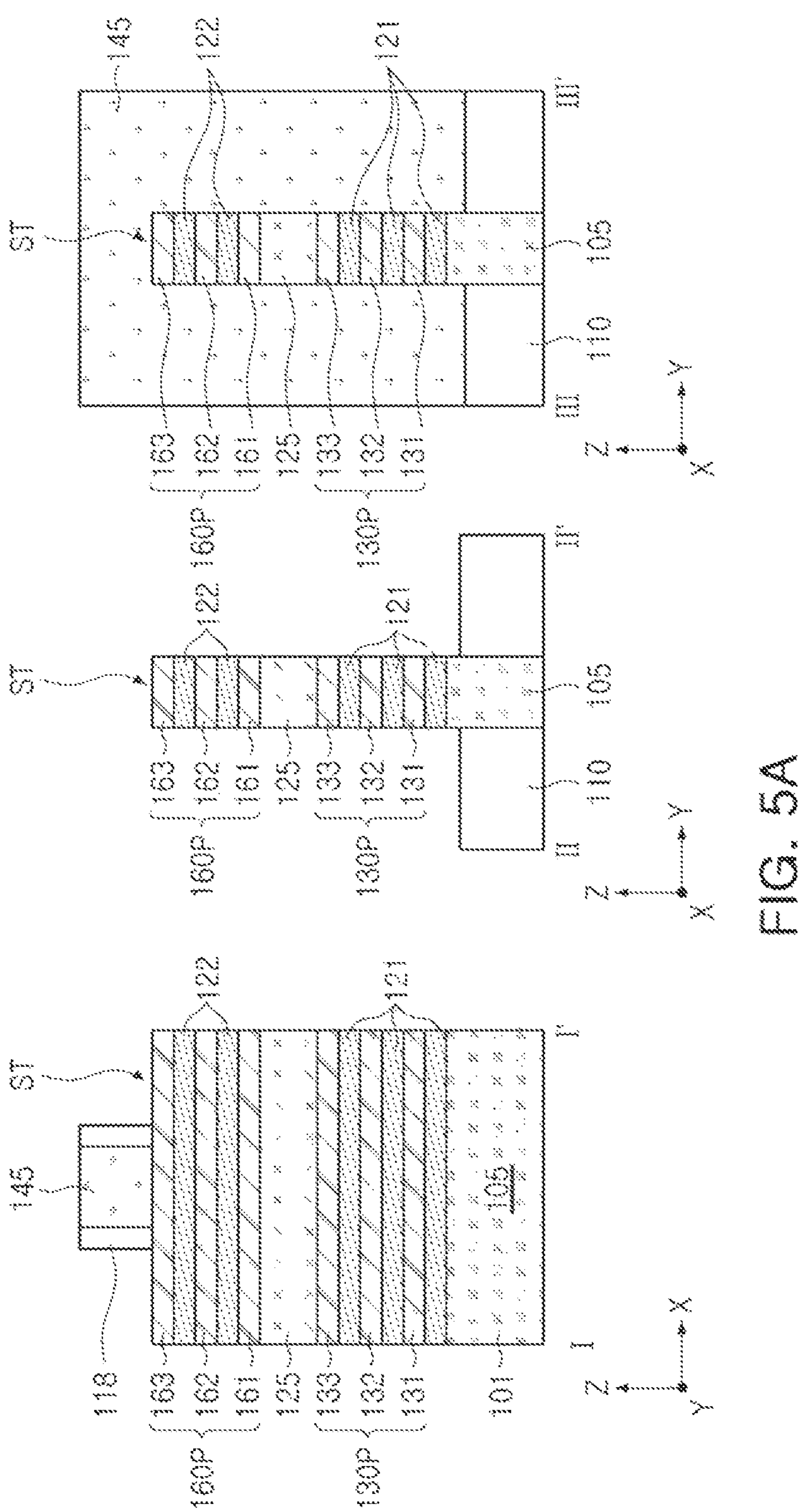
FIGS. 5A, 5B, 5C, 5D, 6, 7, 8A, 8B, 9 and 10 are diagrams illustrating a method of manufacturing a semiconductor device according to example embodiments.

Referring to FIG. 5A, on the substrate 101, a patterned semiconductor structure ST may be formed, the isolation layer 110 may be formed, and a sacrificial gate pattern 145 and a gate spacer 118 may be formed.

On the substrate 101, first sacrificial layers 121 and first layers 130P (which may be referred to as "first channel layers") may be alternately stacked, an intermediate sacrificial layer 125 may be formed, and second sacrificial layers 122 and second layers 160P (which may be referred to as "second channel layers") may be alternately stacked on the intermediate sacrificial layer 125. The first sacrificial layers 121 may be removed through a subsequent process to provide a space filled with the first gate dielectric layer 135 and the first gate electrode 140, as illustrated in FIG. 1B. The second sacrificial layers 122 may be removed through a subsequent process to provide a space filled with the second gate dielectric layer 165 and the second gate electrode 170, as illustrated in FIG. 1B.

The first and second sacrificial layers 121 and 122, the intermediate sacrificial layer 125, and the first and second layers 130P and 160P stacked on the substrate 101 may be patterned to form the semiconductor structure ST. While forming the semiconductor structure ST, a portion of the substrate 101 may also be removed to form the active fin 105. The semiconductor structure ST and the active fin 105 may be formed to have a line shape extending in a direction, for example, an X-direction. In a region from which a portion of the substrate 101 is removed, the isolation layer 110 may be formed by filling an insulating material, and then recessing the insulating material such that the active fin 105 protrudes.

The first and second sacrificial layers 121 and 122 and the first and second layers 130P and 160P may be formed by performing an epitaxial growth process using the substrate 101 as a seed. The first sacrificial layers 121 and the second sacrificial layers 122 may include a material different from those of the first and second layers 130P and 160P. For example, the first sacrificial layers 121 and the second sacrificial layers 122 may include silicon germanium (SiGe), and the first and second layers 130P and 160P may include silicon (Si). Each of the first layers 130P and the second layers 160P may include undoped silicon or doped silicon. An impurity included in the doped silicon may include at least one of carbon, oxygen, boron, phosphorus, arsenic, and gallium. An impurity concentration of the doped silicon may be in a range of about $10^{16}/cm^3$ to about $7\times10^{21}/cm^3$. For example, the doped silicon may include an impurity (e.g., carbon) diffused from the sacrificial layers 121 and 122 or an impurity (e.g., oxygen) diffused from the intermediate sacrificial layer 125 at a concentration ranging from about $10^{16}/cm^3$ to about $10^{19}/cm^3$. The intermediate sacrificial layer 125 may include a material different from those of the first and second sacrificial layers 121 and 122, or the first and second sacrificial layers 121 and 122 may include a material different from that of the intermediate sacrificial layer 125.

Each of the first and second sacrificial layers 121 and 122 and the first and second layers 130P and 160P may have a thickness ranging from about 5 nm to about 15 nm. The number of the first and second sacrificial layers 121 and 122 and the first and second layers 130P and 160P that are stacked may be changed in various manners in some example embodiments.

The sacrificial gate pattern 145 may intersect the semiconductor structure ST and extend in a Y-direction. The sacrificial gate pattern 145 may include a plurality of patterns and/or a mask pattern.

Figure 5B:
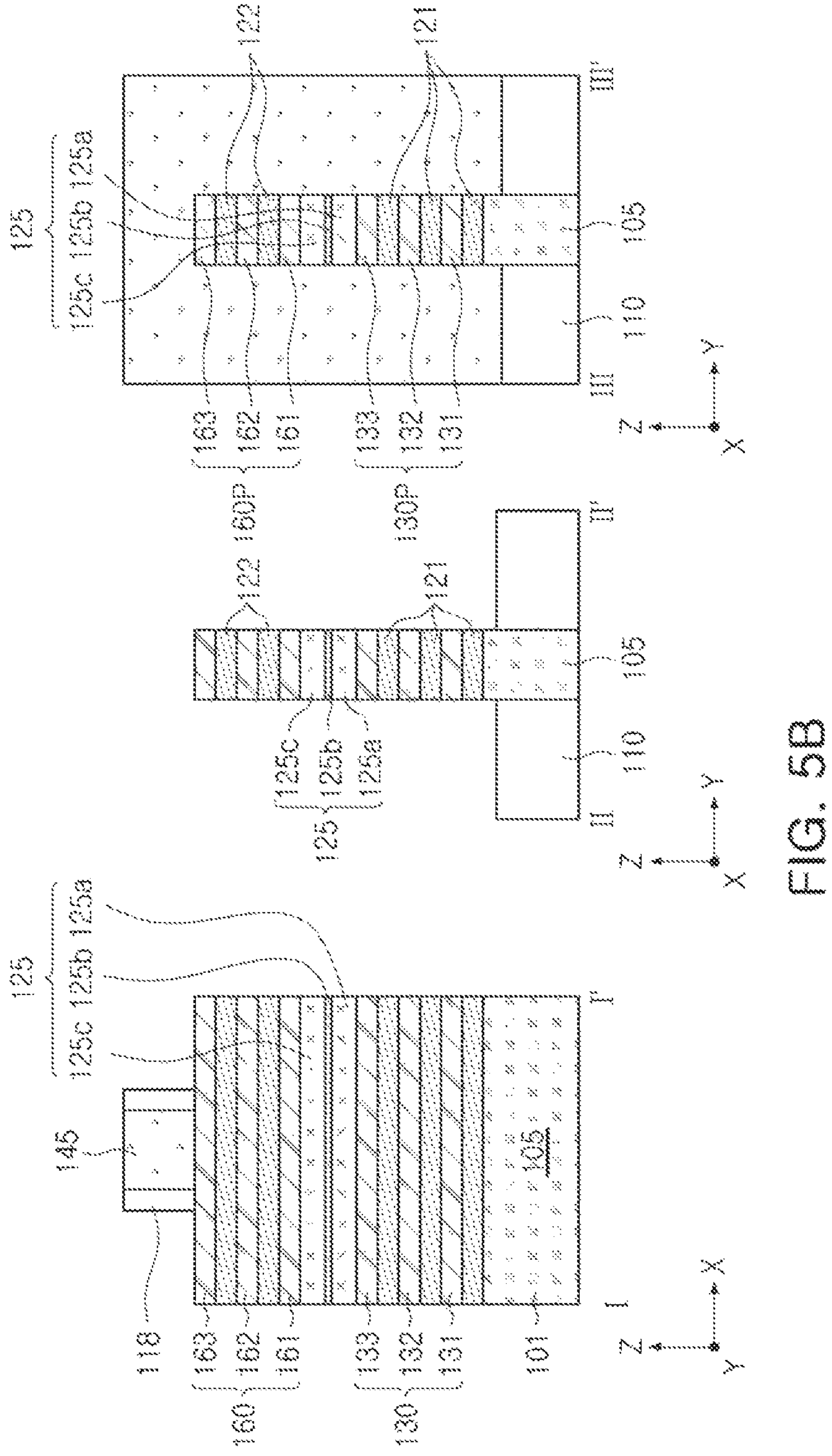

Referring to FIG. 5B, when compared to FIG. 5A, the intermediate sacrificial layer 125 may include a first intermediate layer 125*a*, a second intermediate layer 125*b*, and a third intermediate layer 125*c*. The second intermediate layer 125*b* may be disposed between the first intermediate layer 125*a* and the third intermediate layer 125*c*. The first and third intermediate layers 125*a* and 125*c* may include a material different from that of the second intermediate layer 125*b*. For example, each of the first and third intermediate layers 125*a* and 125*c* may include a silicon germanium layer or a silicon germanium layer including an oxygen element as an impurity.

Figure 5C:
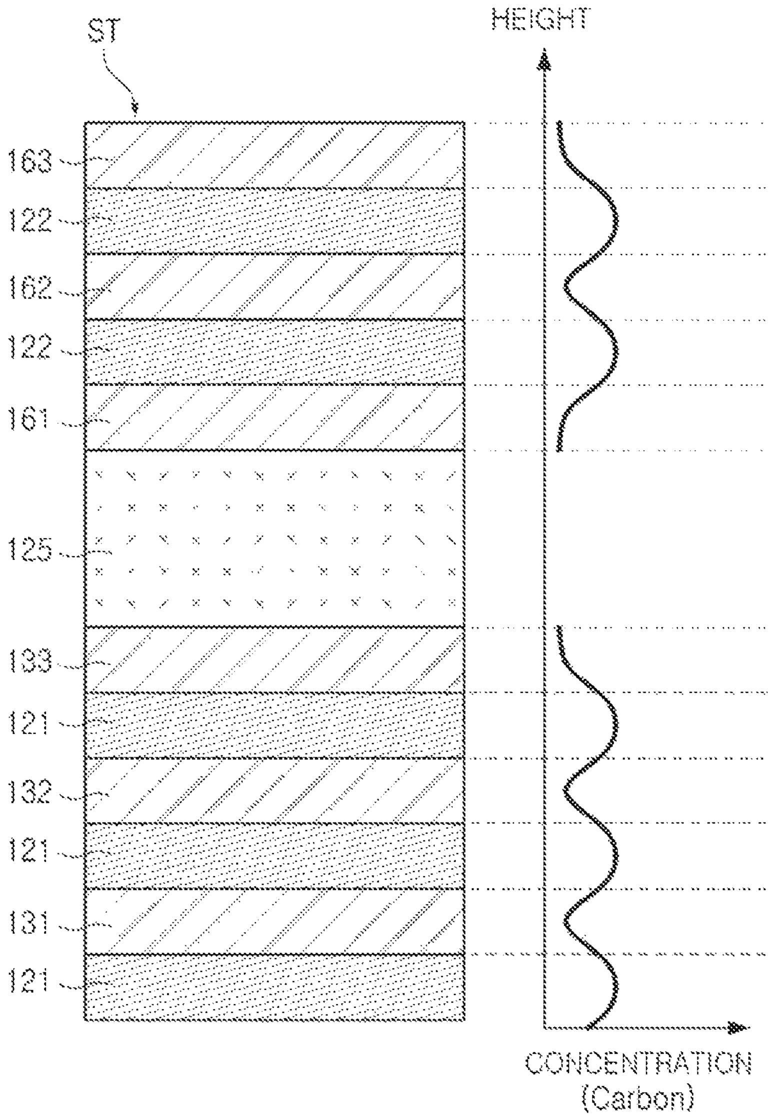
Figure 5D:
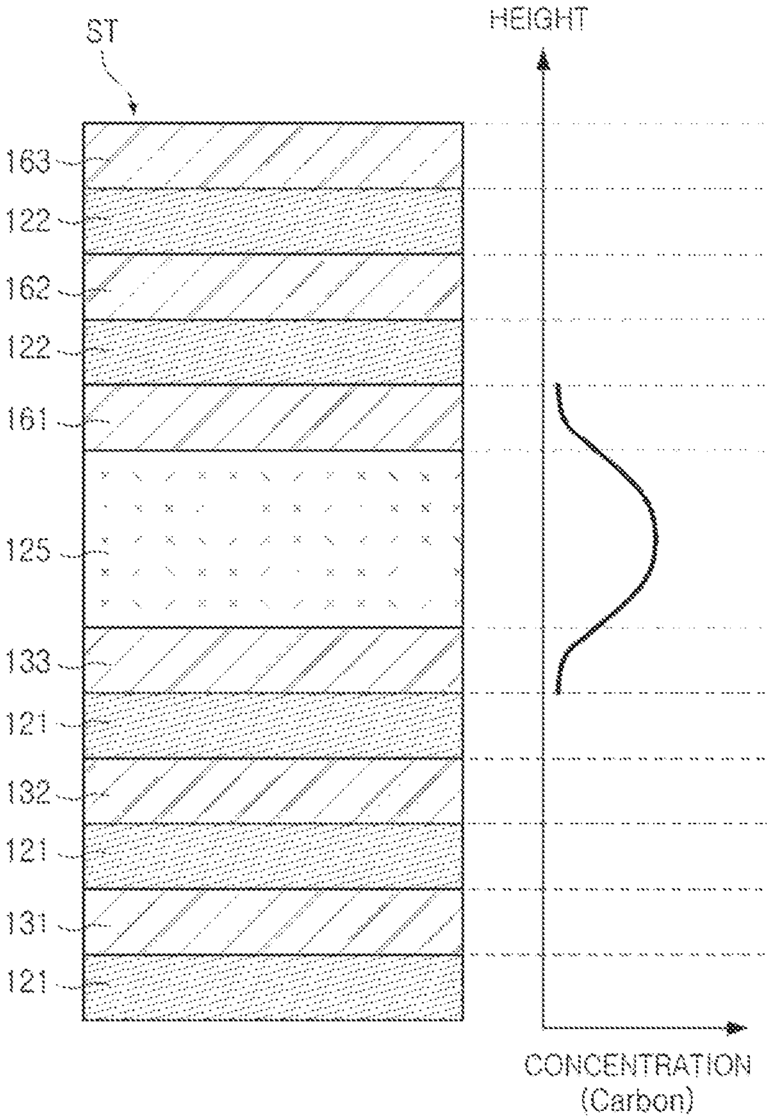

FIGS. 5C and 5D illustrate impurity concentrations according to heights of layers stacked on the semiconductor structure ST.

Referring to FIG. 5C, each of the first sacrificial layers 121 and the second sacrificial layers 122 may be formed of a silicon germanium layer including a carbon element as an impurity.

The first layers 130P may include first to third semiconductor layers 131, 132, and 133 including an impurity (e.g., carbon) diffused from the first sacrificial layers 121. For example, the first semiconductor layer 131 and the second semiconductor layer 132 may be disposed between the first sacrificial layers 121. The impurity (e.g., carbon) may be diffused from an upper surface of the first semiconductor layer 131 and a lower surface of the first semiconductor layer 131 toward a central portion of the first semiconductor layer 131. The impurity (e.g., carbon) may be diffused from an upper surface of the second semiconductor layer 132 and a lower surface of the second semiconductor layer 132 toward a central portion of the second semiconductor layer 132. The third semiconductor layer 133 may contact the adjacent first sacrificial layer 121 through a lower surface thereof, and thus the impurity (e.g., carbon) may be diffused from a lower surface of the third semiconductor layer 133 toward an upper surface of the third semiconductor layer 133.

The second layers 160P may include fourth to sixth semiconductor layers 161, 162, and 163 including an impurity (e.g., carbon) diffused from the second sacrificial layers 122. For example, the fifth semiconductor layer 162 may be disposed between the second sacrificial layers 122, and thus the impurity (e.g., carbon) may be diffused from an upper surface of the fifth semiconductor layer 162 and a lower surface of the fifth semiconductor layer 162 toward a central portion of the fifth semiconductor layer 162. For example, the fourth semiconductor layer 161 may contact the adjacent second sacrificial layer 122 through an upper surface thereof, and thus the impurity (e.g., carbon) may be diffused from an upper surface of the fourth semiconductor layer 161 toward a lower surface of the fourth semiconductor layer 161. For example, the sixth semiconductor layer 163 may contact the adjacent second sacrificial layer 122 through a lower surface thereof, and thus the impurity (e.g., carbon) may be diffused from the lower surface of the sixth semiconductor layer 163 toward an upper surface of the sixth semiconductor layer 163.

Figure 6:
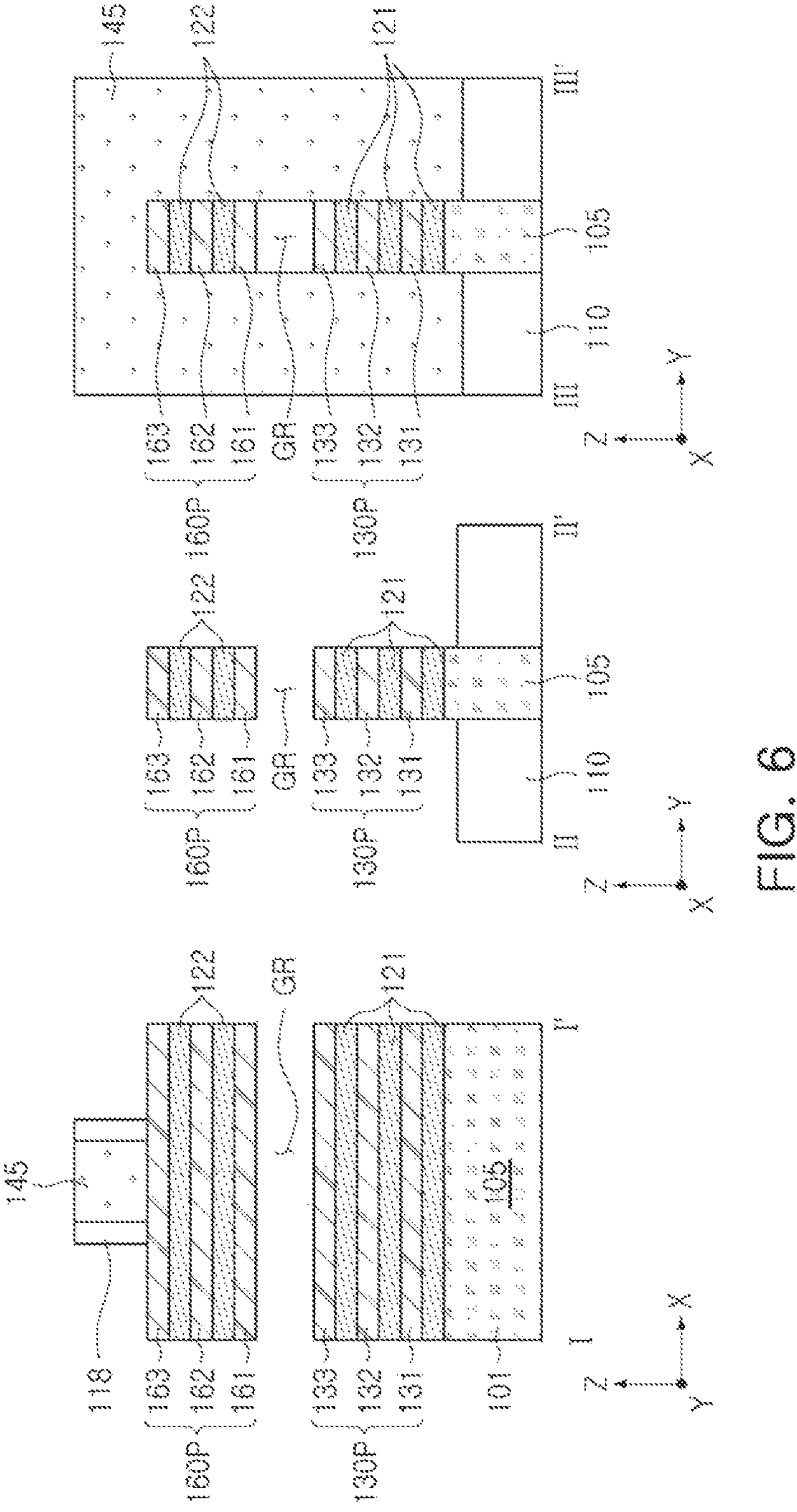

When the first and second sacrificial layers 121 and 122 do not include a carbon element as an impurity, and are formed of silicon germanium layers not containing germanium having a low concentration (for example, about 25%), the intermediate sacrificial layer 125 may need to be formed of a silicon germanium layer containing germanium having a concentration (for example, about 50% or more) relatively higher than those of the first and second sacrificial layers 121 and 122 for a first strip process of selectively removing the intermediate sacrificial layer 125 (see FIG. 6). In this case, the silicon germanium layer containing a high concentration of germanium may generate film stress due to a lattice difference between a silicon element and a germanium element, and thus it may be highly likely to cause a crystal defect in an epitaxial layer.

A silicon germanium layer including the carbon element as an impurity may have improved resistance with respect to etching of a first strip process as compared to a silicon germanium layer not including the carbon element as an impurity. Accordingly, even when the intermediate sacrificial layer 125 is formed of a silicon germanium layer including a low concentration of germanium, the first and second sacrificial layers 121 and 122 may be formed of silicon germanium layers including a carbon element as an impurity. Accordingly, in the first strip process, the intermediate sacrificial layer 125 may be selectively removed with respect to the first and second sacrificial layers 121 and 122. In this case, it may not be necessary to form a silicon germanium layer including a high concentration of germanium in the semiconductor structure ST, thereby reducing or minimizing a risk of a crystal defect occurring in semiconductor epitaxial layers of the first and second layers 130P and 160P. Accordingly, a semiconductor device including channel layers having improved electrical properties and reliability may be provided.

Referring to FIG. 5D, the intermediate sacrificial layer 125 may be formed of a silicon germanium layer including an oxygen element as an impurity.

Among the first layers 130P, an uppermost third semiconductor layer 133 most adjacent to the intermediate sacrificial layer 125 may contact the intermediate sacrificial layer 125 through an upper surface thereof. An impurity (e.g., oxygen) may be diffused from an upper surface of the third semiconductor layer 133 toward a lower surface of the third semiconductor layer 133.

Among the second layers 160P, a lowermost fourth semiconductor layer 161 most adjacent to the intermediate sacrificial layer 125 may contact the intermediate sacrificial layer 125 through a lower surface thereof. An impurity (e.g., oxygen) may be diffused from a lower surface of the fourth semiconductor layer 161 toward an upper surface of the fourth semiconductor layer 161.

A silicon germanium layer including an oxygen element as an impurity may have reduced resistance to etching of a first strip process as compared to a silicon germanium layer not including an oxygen element as an impurity. Accordingly, the intermediate sacrificial layer 125 may be formed of a silicon germanium layer including an oxygen element as an impurity instead of a silicon germanium layer including a high concentration of germanium, the intermediate sacrificial layer 125 may be selectively and easily removed with respect to the first and second sacrificial layers 121 and 122 in the first strip process. In this case, it may not be necessary to form a silicon germanium layer including a high concentration of germanium in the semiconductor structure ST, thereby reducing or minimizing a risk of a crystal defect occurring in semiconductor epitaxial layers of the first and second layers 130P and 160P. Accordingly, a semiconductor device including channel layers having improved electrical properties and reliability may be provided.

Referring to FIG. 6, the intermediate sacrificial layer 125 may be selectively removed by a first strip process.

The intermediate sacrificial layer 125 may be selectively removed with respect to the first and second sacrificial layers 121 and 122 and the first and second layers 130P and 160P, and thus a gap region GR may be formed. Materials of the first and second sacrificial layers 121 and 122 may have etch resistance higher than a material of the intermediate sacrificial layer 125 in the first strip process. A film property provided by stacked layers of the semiconductor structure ST may be implemented as illustrated in FIG. 5A or a film property provided by having stacked layers of the semiconductor structure ST may be implemented as illustrated in FIG. 5B, thereby easily performing selective removal on the intermediate sacrificial layer 125 even when the intermediate sacrificial layer 125 is not formed as a silicon germanium layer including a high concentration of germanium.

Figure 7:
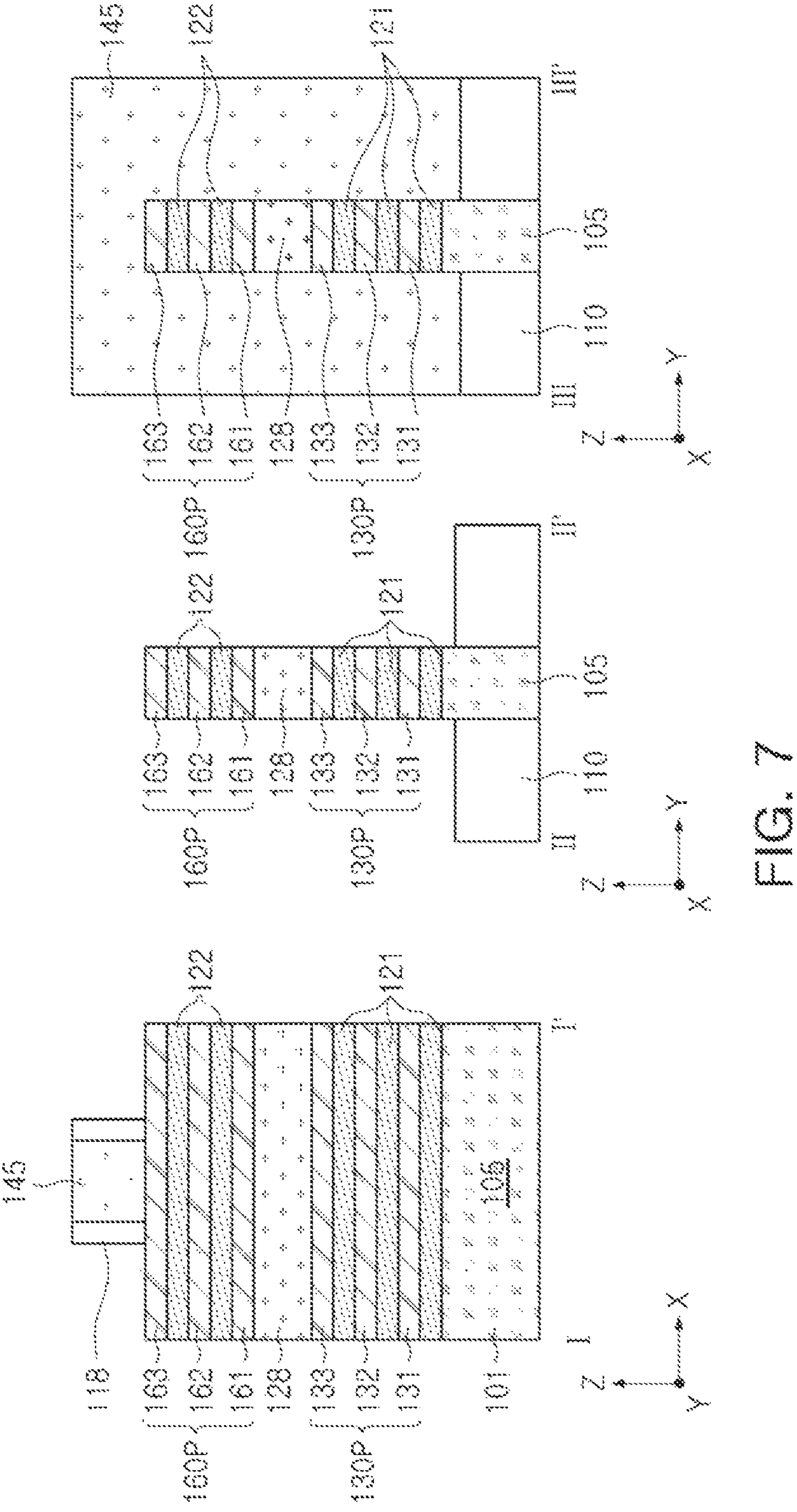

Referring to FIG. 7, the intermediate layer 128 may be formed in the gap region GR. The intermediate layer 128 may include at least one of SiO, SiN, SiCN, SiOC, SiON, SiOCN, SiBN, and SiBCN. The intermediate layer 128 may include a material different from those of the first and second sacrificial layers 121 and 122 and the first and second layers 130P and 160P.

Figure 8A:
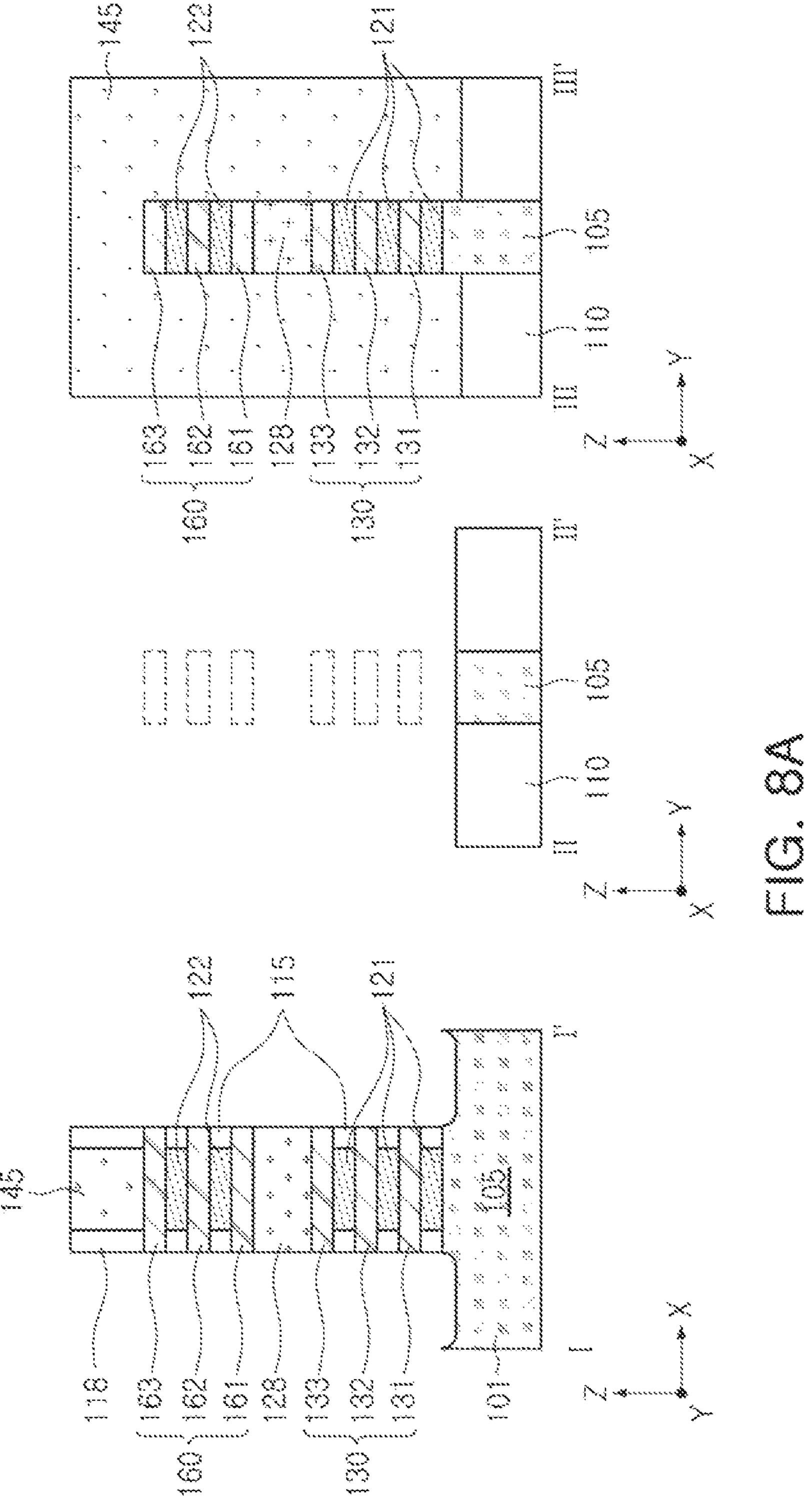

Referring to FIG. 8A, the exposed semiconductor structure ST may be etched using the sacrificial gate pattern 145 and the gate spacer 118 as a mask, the first and second sacrificial layers 121 and 122 may be partially removed from a side surface thereof, and inner spacers 115 may be formed in a region from which the first and second sacrificial layers 121 and 122 are removed.

As the semiconductor structure ST is etched, the active fin 105 may also be partially etched to form a recess region in which an upper surface of the active fin 105 is exposed. The first and second layers 130P and 160P may have a limited length in an X-direction, and may form the channel layers 130 and 160 in FIG. 1B.

The inner spacers 115 may be formed by filling an insulating material in a region from which the first and second sacrificial layers 121 and 122 are partially removed, and removing the insulating material deposited on the outside of the channel layers 130 and 160. The inner spacers 115 may be formed of a material the same as those of the gate spacers 118, but are not limited thereto. The inner spacers 115 may include at least one of SiN, SiCN, SiOCN, SiBCN, and SiBN. However, in some example embodiments, a process of forming the inner spacers 115 may be omitted.

Figure 8B:
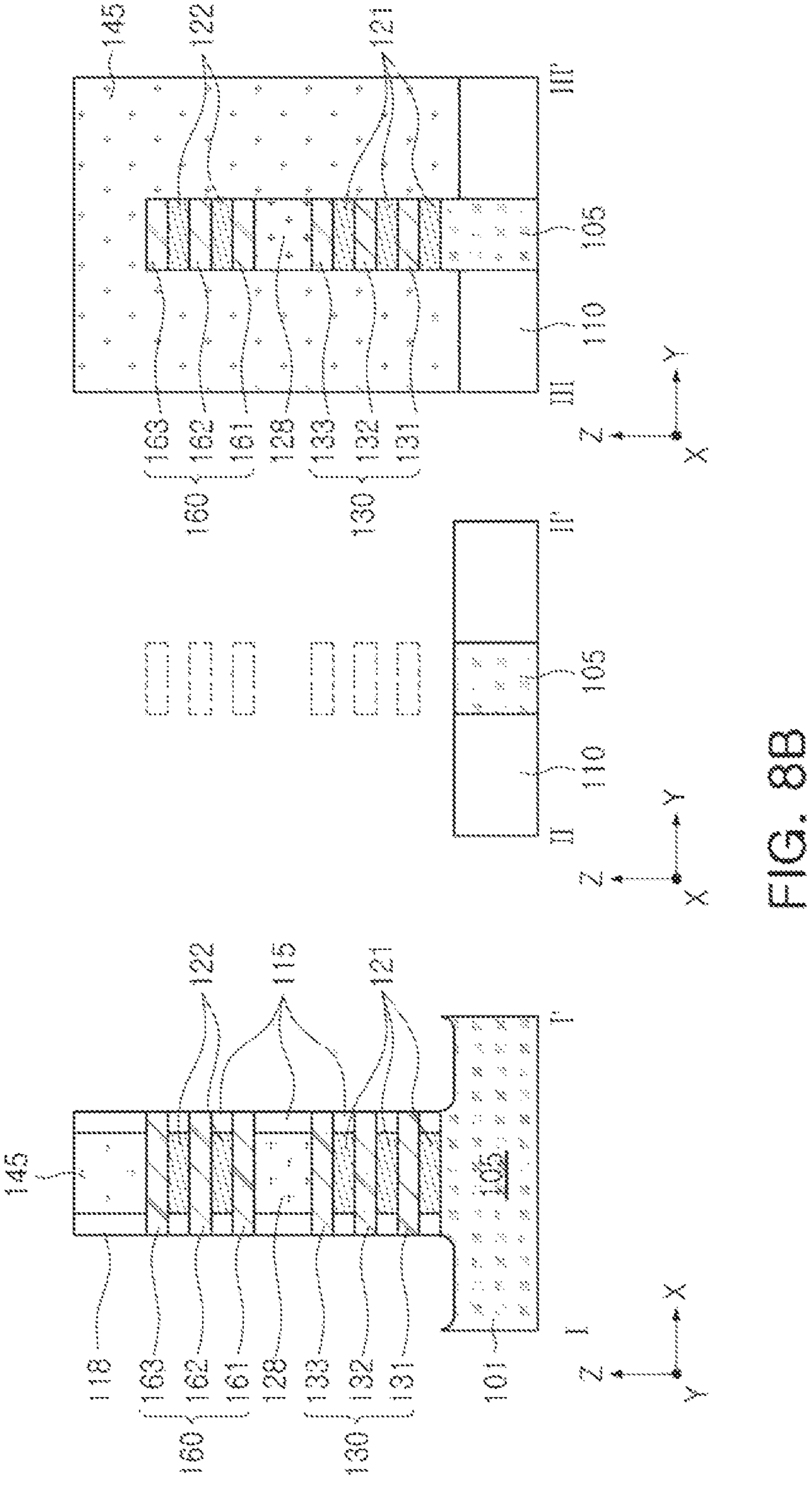

Referring to FIG. 8B, when compared to FIG. 8A, the intermediate layer 128 may also be partially removed from a side thereof, and the inner spacers 115 may be formed even in a region from which the intermediate layer 128 is removed.

Figure 9:
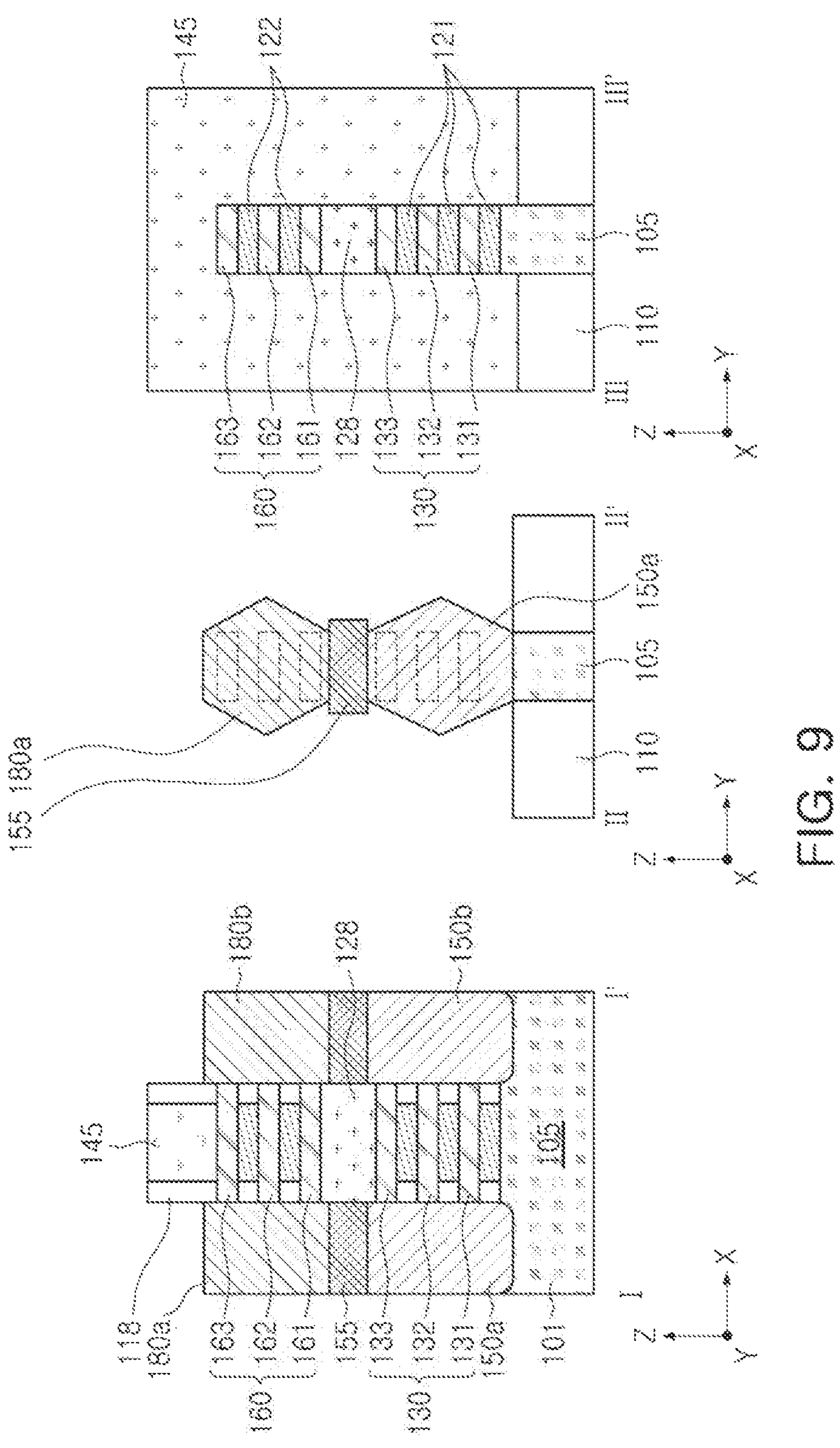

Referring to FIG. 9, first and second source/drain regions 150*a* and 150*b* may be formed on an upper surface of the active fin 105 having an exposed recess region, an insulating layer 155 may be formed on the and the first and second source/drain regions 150*a* and 150*b*, and third and fourth source/drain regions 180*a* and 180*b* may be formed on the insulating layer 155.

The first and second source/drain regions 150*a* and 150*b* may include epitaxial layers grown from the active fin 105 and the first channel layers 130 by performing an epitaxial growth process. The first and second source/drain regions 150*a* and 150*b* may include impurities by in-situ doping, and may include a plurality of layers having different doping elements and/or doping concentrations.

The third and fourth source/drain regions 180*a* and 180*b* may include epitaxial layers grown from the second channel layers 160 by performing an epitaxial growth process. The third and fourth source/drain regions 180*a* and 180*b* may include impurities by in-situ doping, and may include a plurality of layers having different doping elements and/or doping concentrations. A conductivity type of an impurity doped in the third and fourth source/drain regions 180*a* and 180*b* may be different from a conductivity type of an impurity doped in the first and second source/drain regions 150*a* and 150*b*.

Figure 10:
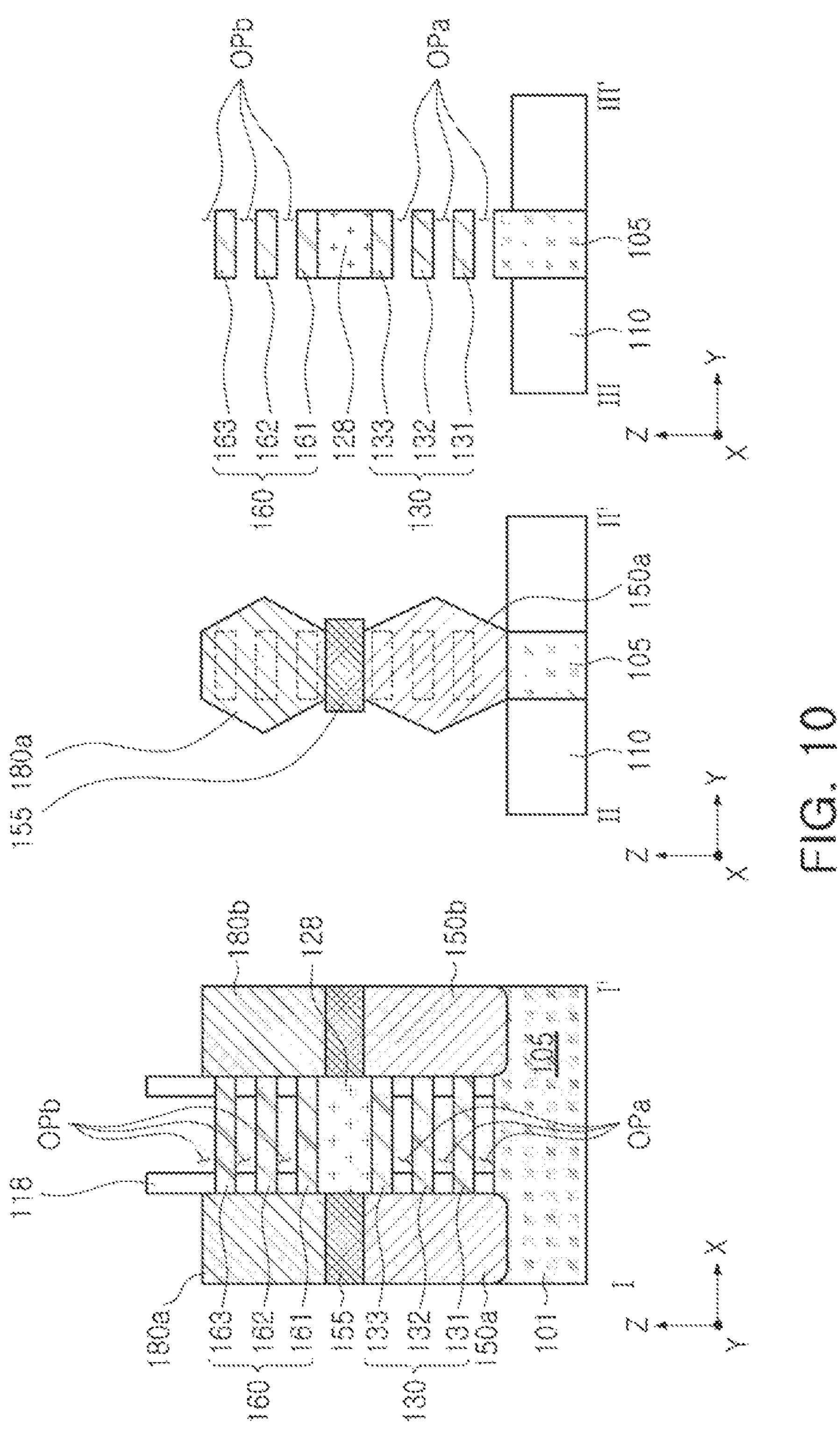

Referring to FIG. 10, the sacrificial gate pattern 145 may be removed, and the first and second sacrificial layers 121 and 122 may be selectively removed through a second strip process.

First, the sacrificial gate pattern 145 may be selectively removed to expose side surfaces of the first and second sacrificial layers 121 and 122. Next, through a second strip process, the first and second sacrificial layers 121 and 122 may be selectively removed with respect to the first and second channel layers 130 and 160. Accordingly, first openings OPa and second openings OPb may be formed.

The intermediate layer 128 may remain without being removed. However, in another example, the intermediate layer 128 may be selectively removed through an etching process. In addition, even when the inner spacers 115 are formed on side surfaces of the intermediate layer 128 as illustrated in FIG. 8B, the intermediate layer 128 may remain without being removed or may be selectively removed.

Next, as illustrated in FIGS. 1A and 1B, the gate dielectric layers 135 and 165 and the gate electrodes 140 and 170 may be formed in the openings OPa and OPb, and contact plugs 190A, 190B, 190C, and 195 may be formed, thereby manufacturing the semiconductor device 100.

FIGS. 11, 12, 13, 14, 15, 16, 17, 18, 19 and 20 are diagrams illustrating a method of manufacturing a semiconductor device according to example embodiments. The components illustrated in FIGS. 11 to 20 may correspond to the components illustrated in FIGS. 5A to 10, and thus the corresponding components will be described by citing the components described above in connection with FIGS. 5A to 10.

Figure 11:
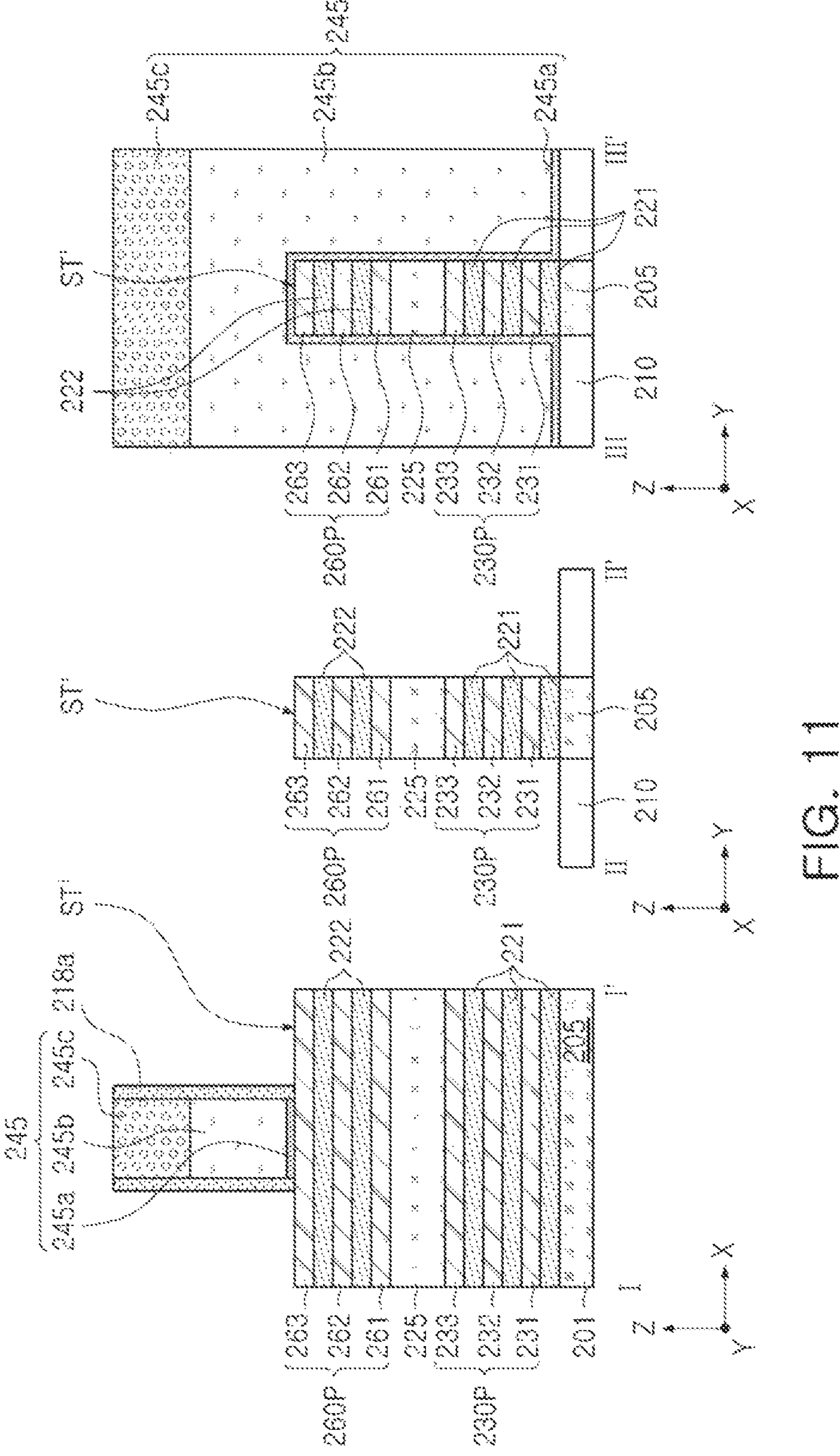
FIGS. 11, 12, 13, 14, 15, 16, 17, 18, 19 and 20 are diagrams illustrating a method of manufacturing a semiconductor device according to example embodiments.

Referring to FIG. 11, on a substrate 201, a patterned semiconductor structure ST' may be formed, an isolation layer 210 defining an active fin 205 may be formed, and a sacrificial gate pattern 245 and a first spacer 218*a* may be formed. 5A. The semiconductor structure ST' may include first and second sacrificial layers 221 and 222, first and second layers 230P and 260P, and an intermediate sacrificial layer 225. The sacrificial gate pattern 245 may include first and second patterns 245*a* and 245*b* and a mask pattern 245*c* that are sequentially stacked.

Figure 12:
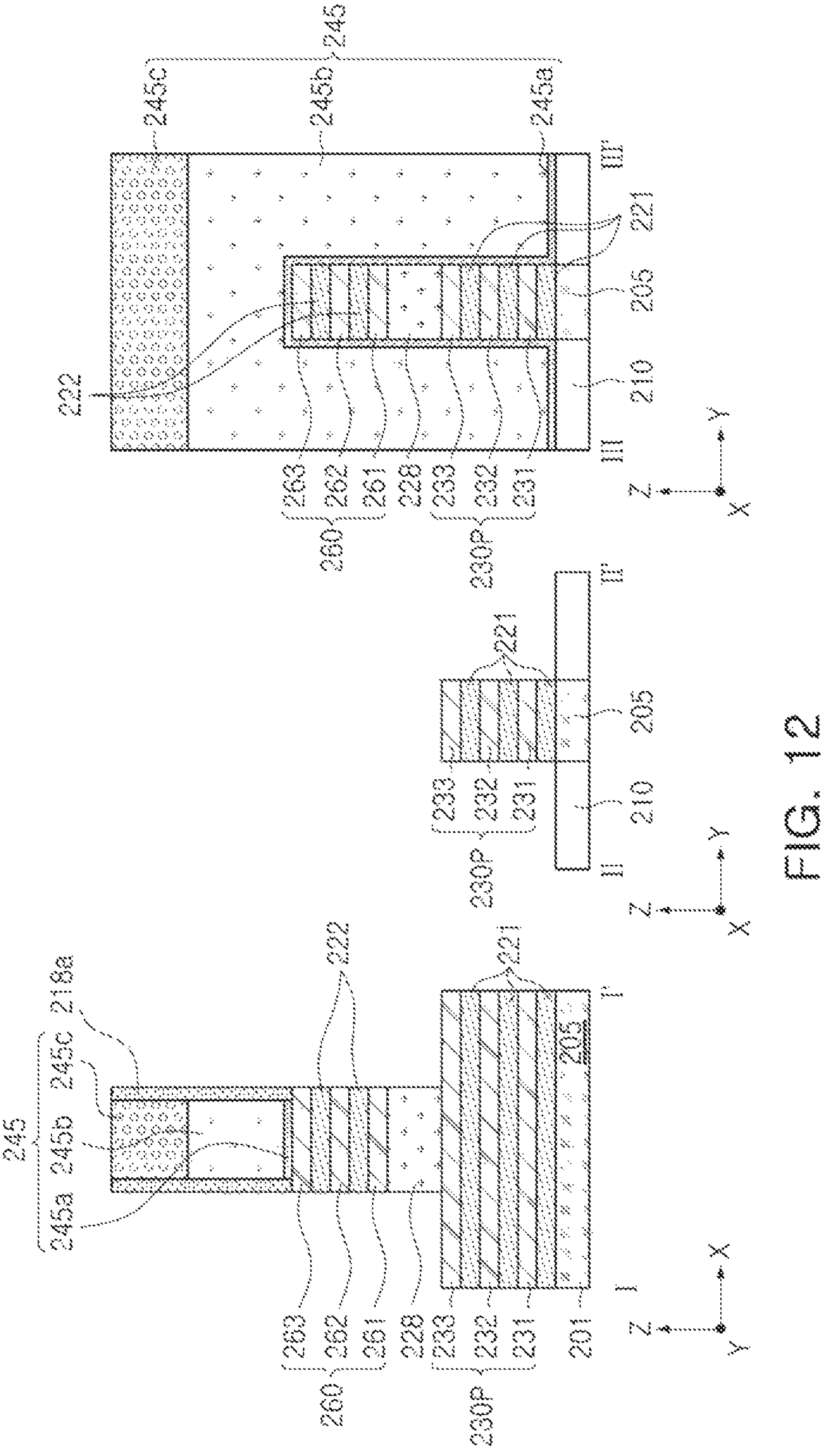

Referring to FIG. 12, after the intermediate sacrificial layer 225 is selectively removed through a first strip process, the intermediate layer 228 may be formed, and the exposed second layers 260P and the second sacrificial layers 222 may be etched using the sacrificial gate pattern 245 and the first spacer 218*a* as a mask. While the second layers 260P and the second sacrificial layers 222 are etched, the intermediate layer 228 may be etched together. Accordingly, the second channel layers 260 having a limited length in an X-direction may be formed. When the intermediate sacrificial layer 225 is removed through the first strip process, the semiconductor structure ST' may have a film configuration as illustrated in FIGS. 5C and 5D, thereby easily performing selective removal on the intermediate sacrificial layer 225, and reducing or minimizing a risk of a crystal defect occurring in channel layers 231, 232, 233, 261, 262, and 263 including semiconductor epitaxial layers.

Figure 13:
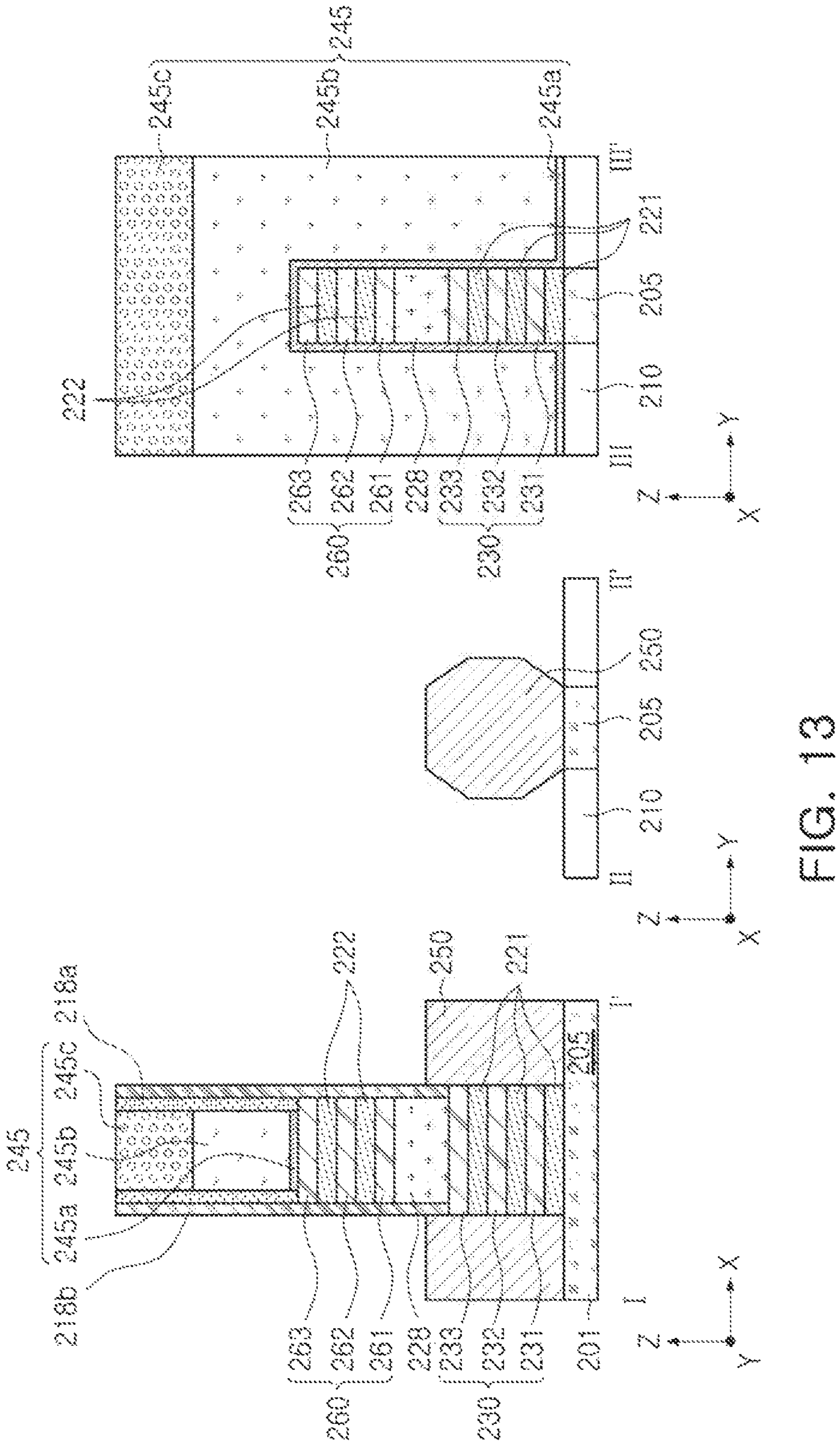

Referring to FIG. 13, a second spacer 218*b* may be formed on a side surface of the first spacer 218*a*, the exposed first layers 230P and the first sacrificial layers 221 may be etched using the sacrificial gate pattern 245 and the spacers 218*a* and 218*b* as a mask, and lower source/drain regions 250 may be formed by performing an epitaxial growth process.

Figure 14:
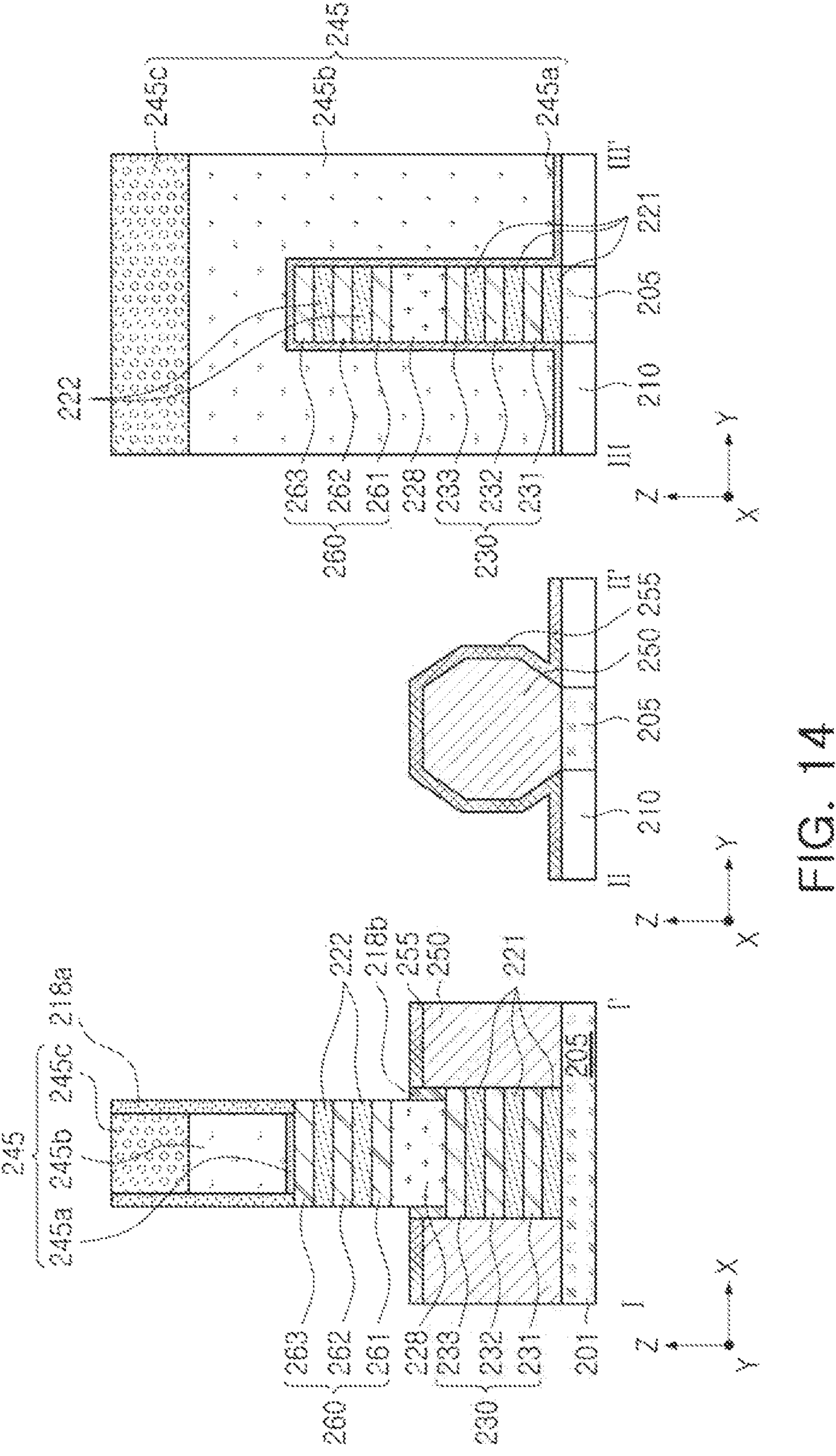

Referring to FIG. 14, a first insulating layer 255 may be formed on the lower source/drain regions 250, and the second spacer 218*b* may be partially etched from an upper portion thereof to expose the second sacrificial layers 222 and the second sacrificial layer 260.

Figure 15:
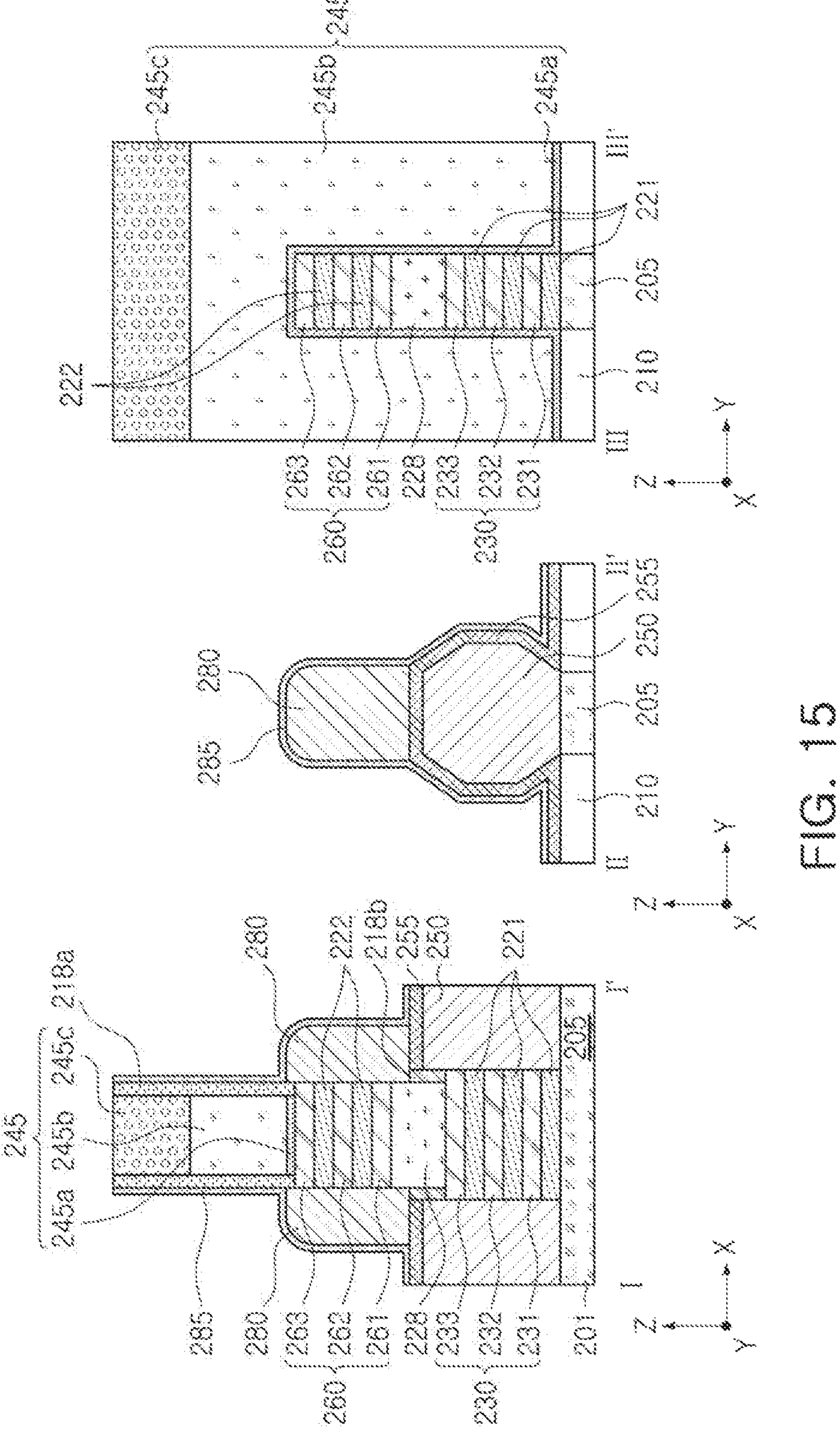

Referring to FIG. 15, an epitaxial growth process may be performed to form upper source/drain regions 280, and a second insulating layer 285 may be formed on the upper source/drain regions 280. The upper source/drain regions 280 may have a shape different from that of the lower source/drain regions 250, and may have a smaller volume than the lower source/drain regions 250.

Figure 16:
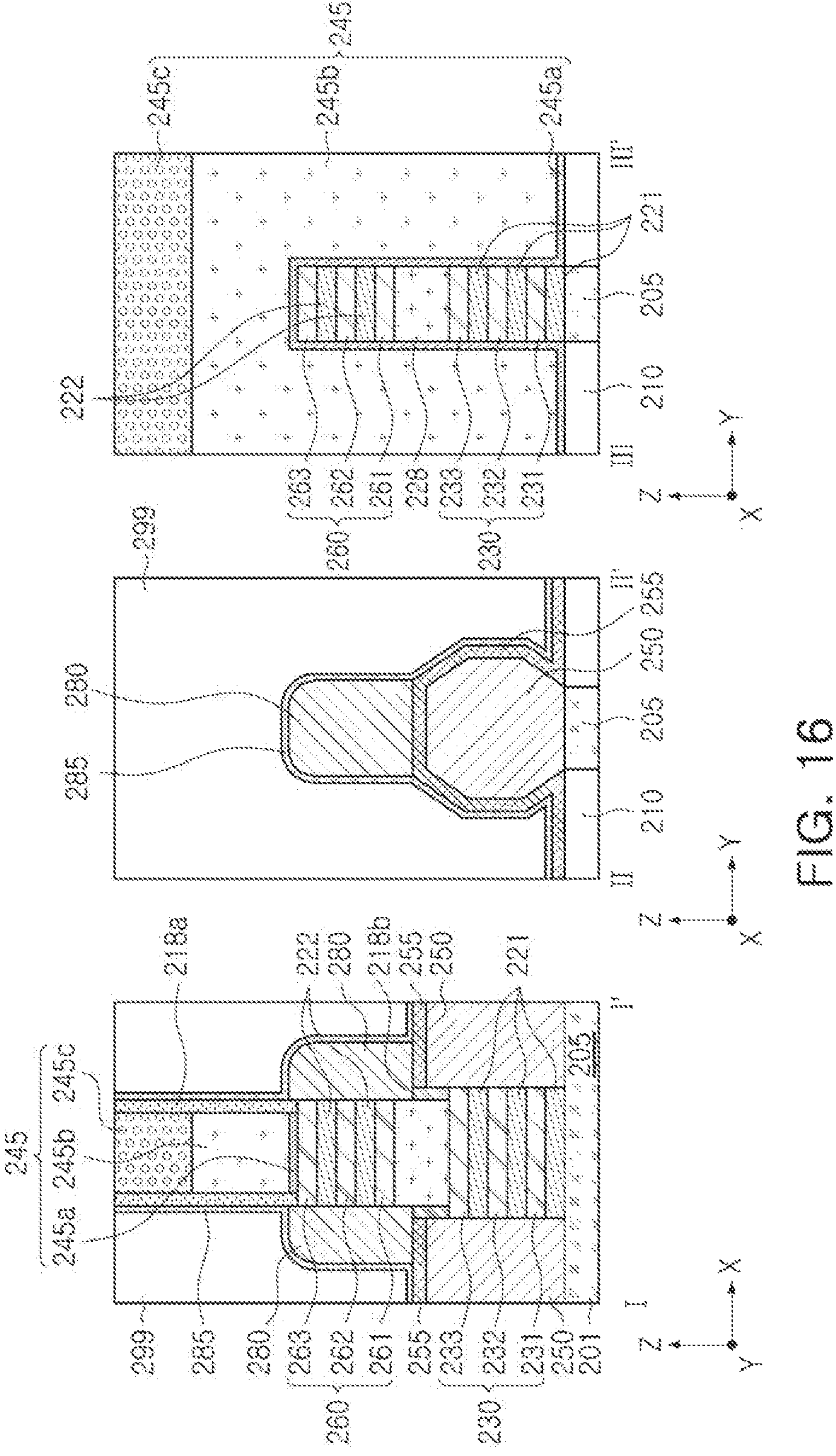

Referring to FIG. 16, an interlayer insulating layer 299 may be formed. The interlayer insulating layer 299 may be formed on the lower and upper source/drain regions 250 and 280, and may cover the second insulating layer 285.

Figure 17:
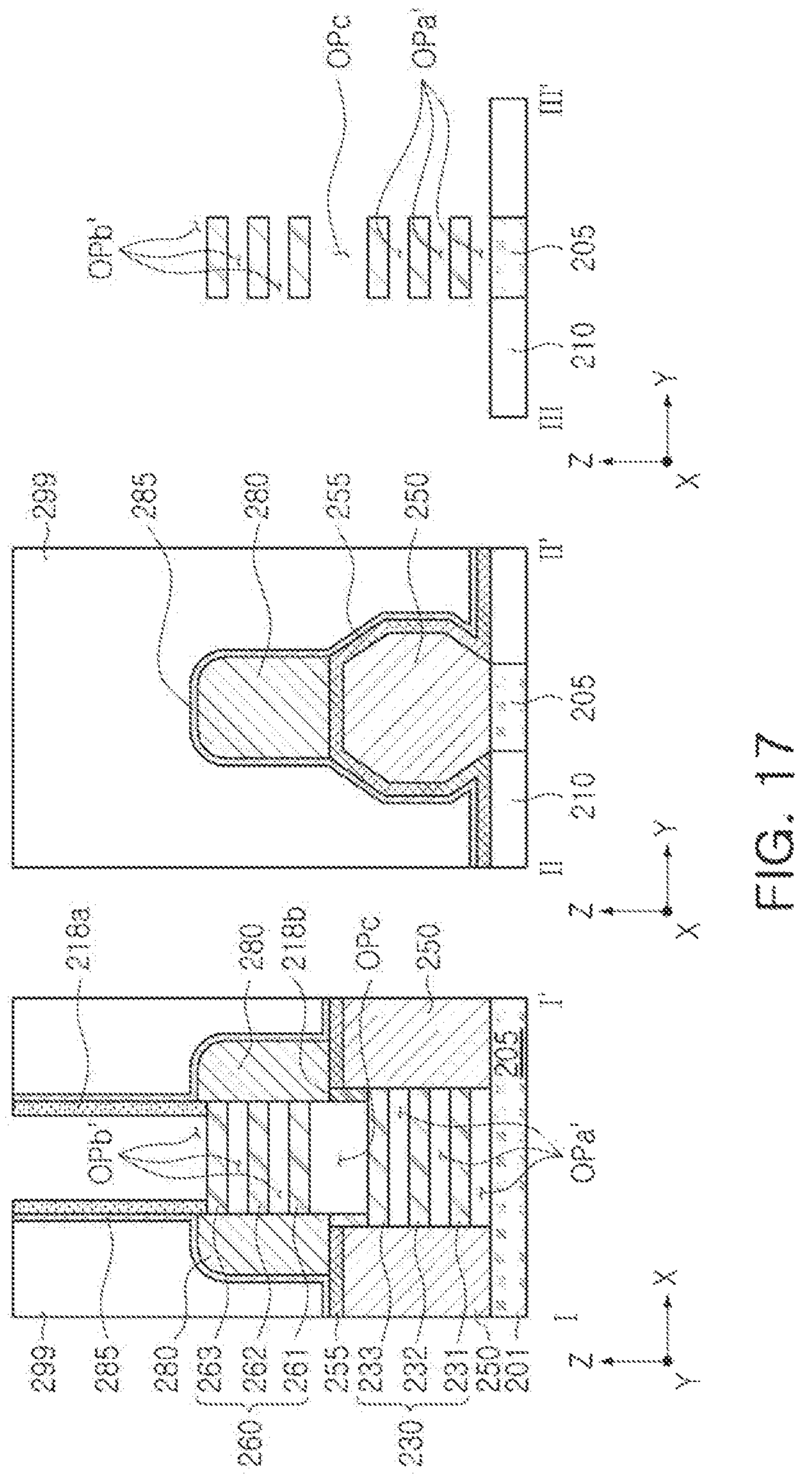

Referring to FIG. 17, the sacrificial gate pattern 245 may be removed, and the first and second sacrificial layers 221 and 222 may be selectively removed through a second strip process. Openings OPa' and OPb' may be formed in a region from which the first and second sacrificial layers 221 and 222 and the sacrificial gate pattern 245 are removed. The intermediate layer 228 may also be removed to form an opening OPc, but is not limited thereto. The intermediate layer 228 may remain or may be removed through a subsequent process.

Figure 18:
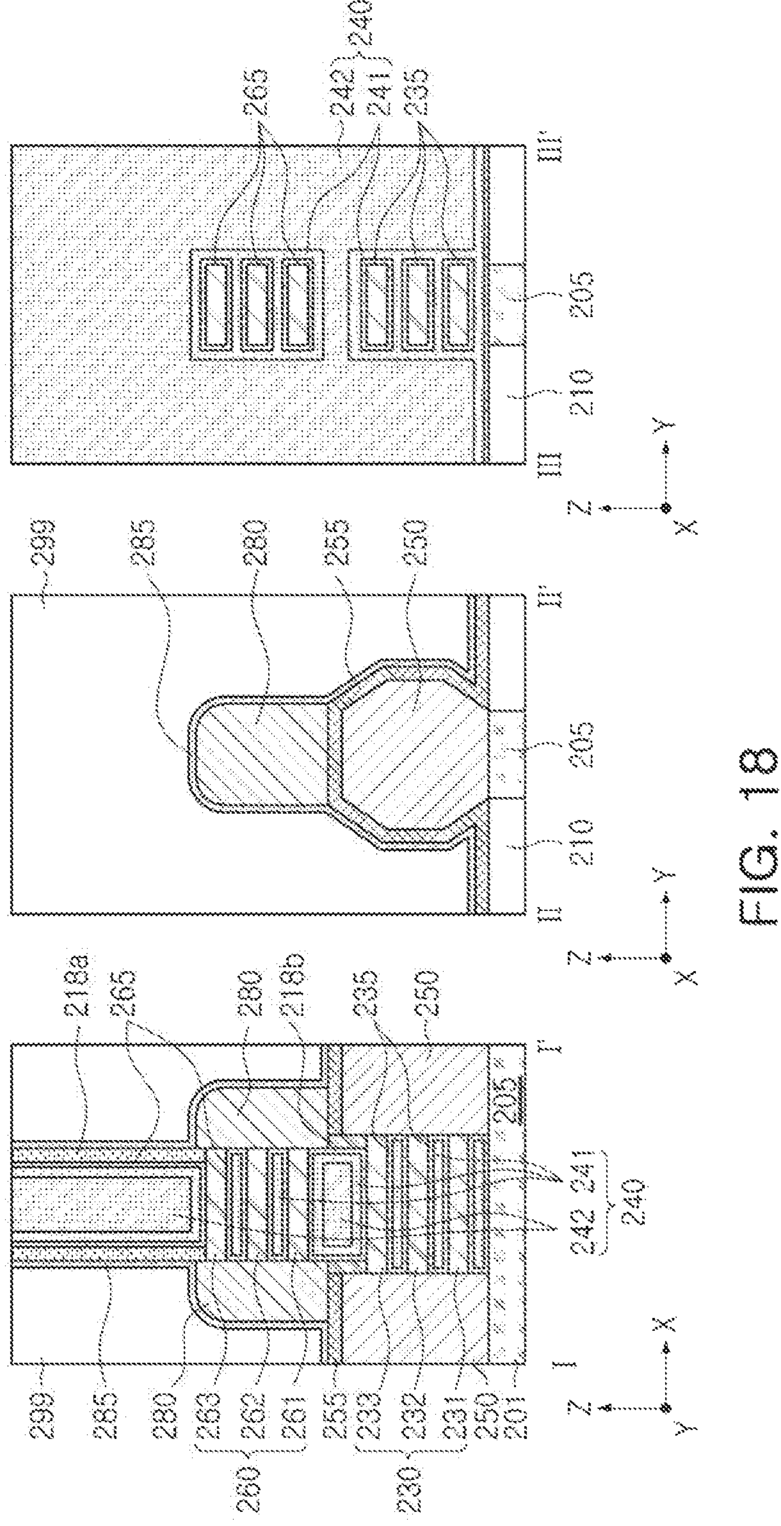

Referring to FIG. 18, gate dielectric layers 235 and 265, a first gate conductive layer 241, and a second gate conductive layer 242 may be formed in the openings OPa', OPb', and OPc. For example, the first gate conductive layer 241 may include TiN, and the second gate conductive layer 242 may include tungsten (W). However, in some example embodiments, types of conductive materials of the first and second gate conductive layers 241 and 242 may be changed in various manners.

Figure 19:
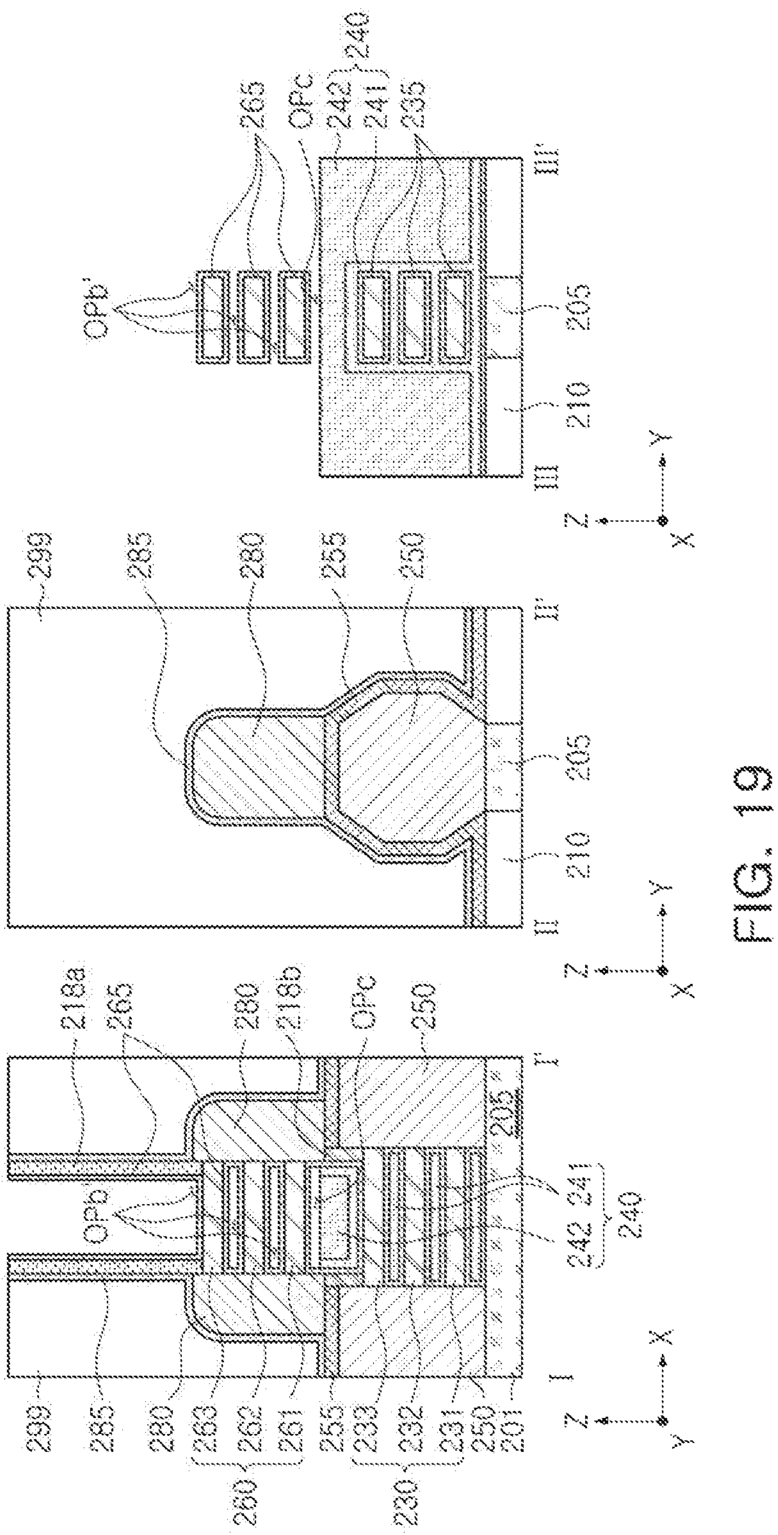

Referring to FIG. 19, a portion of the first gate conductive layer 241 and a portion of the second gate conductive layer 242 may be removed. Accordingly, a first gate electrode 240 of a lower transistor structure may be formed.

Figure 20:
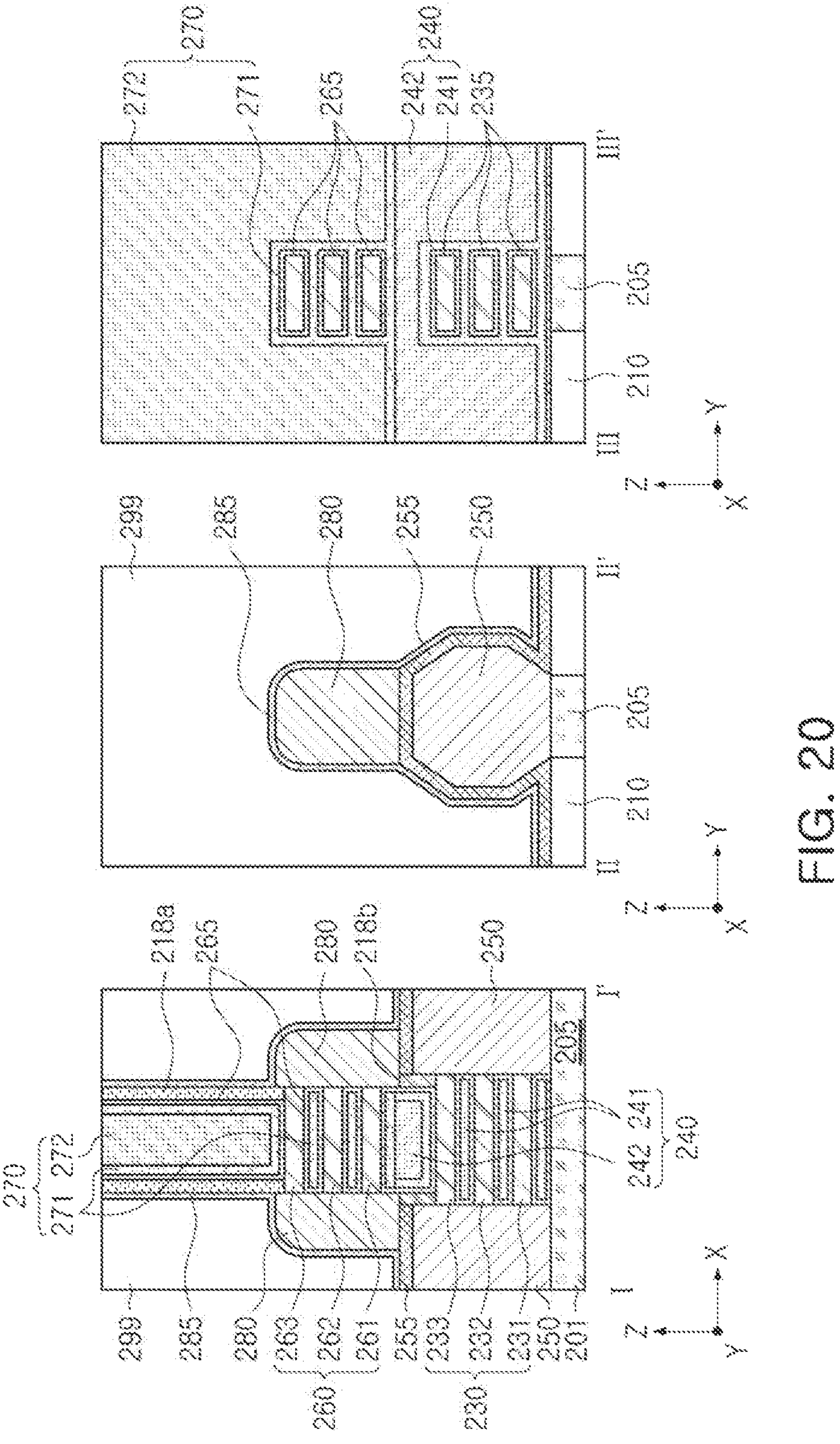

Referring to FIG. 20, a third gate conductive layer 271 and a fourth gate conductive layer 272 may be formed. For example, the third gate conductive layer 271 may include TiAlC, and the fourth gate conductive layer 272 may include tungsten (W). However, in some example embodiments, types of conductive materials of the third and fourth gate conductive layers 271 and 272 may be changed in various manners.

Sacrificial layers may be formed of silicon germanium layers including a carbon element or an oxygen element as an impurity, such that an intermediate sacrificial layer may be selectively removed during a strip process, and a crystal defect occurring in a semiconductor epitaxial layer providing a channel layer may be reduced or minimized, thereby providing a semiconductor device having improved electrical properties and reliability.

Each of the embodiments provided in the above description is not excluded from being associated with one or more features of another example or another embodiment also provided herein or not provided herein but consistent with the disclosure.

While example embodiments have been shown and described above, it will be apparent to those skilled in the art that modifications and variations could be made without departing from the scope of example embodiments as defined by the appended claims.

What is claimed is:

1. A semiconductor device comprising:

a first transistor structure on a substrate, the first transistor structure comprising:

first channel layers spaced apart from each other;

a first gate electrode surrounding the first channel layers;

a first source/drain region connected to the first channel layers on a first side of the first gate electrode; and a second source/drain region connected to the first channel layers on a second side of the first gate electrode that is opposite to the first side of the first gate electrode, and a second transistor structure on the first transistor structure, the second transistor structure comprising:

second channel layers spaced apart from each other;

a second gate electrode surrounding the second channel layers;

a third source/drain region connected to the second channel layers on a first side of the second gate electrode; and a fourth source/drain region connected to the second channel layers on a second side of the second gate electrode that is opposite to first side of the second gate electrode, wherein a width of an upper surface of an uppermost first channel layer among the first channel layers is smaller than a width of a lower surface of the uppermost first channel layer, wherein a width of a lower surface of a lowermost second channel layer among the second channel layers is smaller than a width of an upper surface of the lowermost second channel layer, and wherein at least one channel layer of the first channel layers and the second channel layers comprises a semiconductor layer comprising at least one of carbon (C) and oxygen (O).

2. The semiconductor device of claim 1, wherein the second channel layers vertically overlap the first channel layers.

3. The semiconductor device of claim 1, further comprising:

a first contact plug connected to the first source/drain region;

a second contact plug connected to the third source/drain region; and a third contact plug connected to the second source/drain region and the fourth source/drain region.

4. The semiconductor device of claim 1, further comprising:

an insulating layer between the first source/drain region and the third source/drain region.

5. The semiconductor device of claim 1, further comprising:

an intermediate layer between the first gate electrode and the second gate electrode, the intermediate layer comprising an insulating material.

6. The semiconductor device of claim 1, wherein the first channel layers comprise:

a first semiconductor layer, a second semiconductor layer on the first semiconductor layer, and a third semiconductor layer on the second semiconductor layer, and wherein the second channel layers comprise:

a fourth semiconductor layer, a fifth semiconductor layer on the fourth semiconductor layer, and a sixth semiconductor layer on the fifth semiconductor layer.

7. The semiconductor device of claim 6, wherein the first semiconductor layer has a first carbon concentration gradient in which a concentration of carbon decreases as a distance from an upper surface of the first semiconductor layer to a central portion of the first semiconductor layer and a distance from a lower surface of the first semiconductor layer to the central portion of the first semiconductor layer decrease, wherein the second semiconductor layer has a second carbon concentration gradient in which a concentration of carbon decreases as a distance from an upper surface of the second semiconductor layer to a central portion of the second semiconductor layer and a distance from a lower surface of the second semiconductor layer to the central portion of the second semiconductor layer decrease, and wherein the third semiconductor layer has a third carbon concentration gradient in which a concentration of carbon decreases as a distance from a lower surface of the third semiconductor layer to an upper surface of the third semiconductor layer decreases.

8. The semiconductor device of claim 7, wherein the fourth semiconductor layer has a fourth carbon concentration gradient in which a concentration of carbon decreases as a distance from an upper surface of the fourth semiconductor layer to a lower surface of the fourth semiconductor layer decreases, wherein the fifth semiconductor layer has a fifth carbon concentration gradient in which a concentration of carbon decreases as a distance from an upper surface of the fifth semiconductor layer to a central portion of the fifth semiconductor layer and a distance from a lower surface of the fifth semiconductor layer to the central portion of the fifth semiconductor layer decrease, and wherein the sixth semiconductor layer has a sixth carbon concentration gradient in which a concentration of carbon decreases as a distance from a lower surface of the sixth semiconductor layer to an upper surface of the sixth semiconductor layer decreases.

9. The semiconductor device of claim 6, wherein the third semiconductor layer has a first oxygen concentration gradient in which a concentration of oxygen decreases as a distance from an upper surface of the third semiconductor layer to a lower surface of the third semiconductor layer decreases, and wherein the fourth semiconductor layer has a second oxygen concentration gradient in which a concentration of oxygen decreases as a distance from a lower surface of the fourth semiconductor layer to an upper surface of the fourth semiconductor layer decreases.

10. The semiconductor device of claim 1, wherein the first transistor structure further comprises a first gate dielectric layer between the first channel layers and the first gate electrode, and wherein the second transistor structure further comprises a second gate dielectric layer between the second channel layers and the second gate electrode.

11. A semiconductor device comprising:

a first transistor structure on a substrate, the first transistor structure comprising:

first channel layers spaced apart from each other;

a first gate electrode surrounding the first channel layers; and a first source/drain region connected to the first channel layers on a first side of the first gate electrode; and a second source/drain region connected to the first channel layers on a second side of the first gate electrode that is opposite to the first side of the first gate electrode, and, a second transistor structure on the first transistor structure, the second transistor structure comprising:

second channel layers spaced apart from each other;

a second gate electrode surrounding the second channel layers;

a third source/drain region connected to the second channel layers on a first side of the second gate electrode; and a fourth source/drain region connected to the second channel layers on a second side of the second gate electrode that is opposite to the first side of the second gate electrode, wherein at least one channel layer of the first channel layers and the second channel layers comprises a semiconductor layer comprising an impurity, wherein the semiconductor layer comprises a region in which a concentration of the impurity changes based on a height in a vertical direction, perpendicular to an upper surface of the substrate, and wherein the impurity comprises carbon (C).

12. The semiconductor device of claim 11, wherein the semiconductor layer has an inclined side surface.

13. The semiconductor device of claim 11, wherein an upper surface of the semiconductor layer comprises the impurity in a first concentration, and wherein a central portion of the semiconductor layer comprises the impurity in a second concentration that is lower than the first concentration.

14. The semiconductor device of claim 11, wherein a lower surface of the semiconductor layer comprises the impurity in a first concentration, and wherein a central portion of the semiconductor layer comprises the impurity in a second concentration that is lower than the first concentration.

15. The semiconductor device of claim 11, wherein the semiconductor layer comprises:

a first semiconductor layer, a second semiconductor layer, and a third semiconductor layer, wherein the second semiconductor layer is between the first semiconductor layer and the third semiconductor layer, and wherein a total content of the impurity in the second semiconductor layer is greater than a total content of the impurity in the first semiconductor layer and a total content of the impurity included in the third semiconductor layer.

16. The semiconductor device of claim 11, wherein the impurity further comprises oxygen, wherein the semiconductor layer comprises:

a first semiconductor layer on a level of an uppermost channel layer among the first channel layers, and a second semiconductor layer on a level of a lowermost channel layer among the second channel layers, wherein the first semiconductor layer has a first concentration gradient in which a concentration of oxygen decreases as a distance from an upper surface of the first semiconductor layer to a lower surface of the first semiconductor layer decreases, and wherein the second semiconductor layer has a second concentration gradient in which a concentration of oxygen decreases as a distance from a lower surface of the second semiconductor layer to an upper surface of the second semiconductor layer decreases.

17. The semiconductor device of claim 11, further comprising:

an intermediate layer between the first gate electrode and the second gate electrode, the intermediate layer comprising an insulating material.

18. A semiconductor device comprising:

an active fin on a substrate extending in a first direction;

first channel layers on the active fin and spaced apart from each other;

a first gate electrode surrounding the first channel layers and extending in a second direction that intersects the first direction;

a first source/drain region connected to the first channel layers on a first side of the first gate electrode;

a second source/drain region connected to the first channel layers on a second side of the first gate electrode that is opposite to the first side of the first gate electrode;

second channel layers vertically overlapping the first channel layers and spaced apart from each other;

a second gate electrode surrounding the second channel layers, extending in the second direction, and vertically overlapping the first gate electrode;

a third source/drain region connected to the second channel layers on a first side of the second gate electrode; and a fourth source/drain region connected to the second channel layers on a second side of the second gate electrode that is opposite to the first side of the second gate electrode, wherein the first channel layers comprise a first semiconductor layer comprising a first impurity, the first semiconductor layer being an uppermost channel layer among the first channel layers, wherein the second channel layers comprise a second semiconductor layer comprising a second impurity, the second semiconductor layer being a lowermost channel layer among the second channel layers, wherein an upper surface or a lower surface of the first semiconductor layer comprises the first impurity in a first concentration, wherein a central portion of the first semiconductor layer comprises the first impurity in a second concentration that is lower than the first concentration, wherein an upper surface or a lower surface of the second semiconductor layer comprises the second impurity in a third concentration, wherein a central portion of the second semiconductor layer comprises the second impurity in a fourth concentration that is lower than the third concentration, and wherein at least one of the first impurity and the second impurity comprises carbon (C).

19. The semiconductor device of claim 18, wherein a width of the upper surface of the first semiconductor layer is smaller than a width of the lower surface of the first semiconductor layer, and wherein a width of the lower surface of the second semiconductor layer is smaller than a width of the upper surface of the second semiconductor layer.

20. The semiconductor device of claim 18, wherein the active fin comprises a third impurity, wherein the third impurity has a concentration decreasing downward from an upper surface of the active fin, and wherein the third impurity comprises carbon.

* * * * *